United States Patent
Bird et al.

(10) Patent No.: US 7,979,983 B2
(45) Date of Patent: Jul. 19, 2011

(54) CONNECTION AN INTEGRATED CIRCUIT ON A SURFACE LAYER OF A PRINTED CIRCUIT BOARD

(75) Inventors: Steven C. Bird, San Jose, CA (US); Linda M. Mazaheri, Los Gatos, CA (US); Bob Needham, San Jose, CA (US); Phuong Rosalynn Duong, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 1078 days.

(21) Appl. No.: 11/696,670

(22) Filed: Apr. 4, 2007

(65) Prior Publication Data

US 2008/0245556 A1    Oct. 9, 2008

(51) Int. Cl.
*H01K 3/10*  (2006.01)
*H05K 1/11*  (2006.01)

(52) U.S. Cl. ............... 29/852; 29/832; 29/831; 29/846; 29/847; 174/262

(58) Field of Classification Search ............ 29/852, 29/846, 847, 874, 845, 830, 831, 832; 716/15, 716/12, 1, 7, 8; 174/262; 324/537, 754; 361/761, 764, 780
See application file for complete search history.

(56) References Cited

U.S. PATENT DOCUMENTS

| | | | |
|---|---|---|---|
| 4,677,526 A * | 6/1987 | Muehling | 361/718 |
| 5,783,857 A | 7/1998 | Ziegner et al. | |
| 5,784,262 A * | 7/1998 | Sherman | 361/777 |
| 6,239,482 B1 | 5/2001 | Fillion et al. | |
| 6,291,897 B1 * | 9/2001 | Wark et al. | 257/786 |
| 6,310,398 B1 | 10/2001 | Katz | |
| 6,373,717 B1 | 4/2002 | Downes, Jr. et al. | |
| 6,388,890 B1 | 5/2002 | Kwong et al. | |
| 6,594,811 B2 * | 7/2003 | Katz | 716/12 |
| 6,885,102 B2 * | 4/2005 | Singh et al. | 257/738 |
| 6,945,791 B2 * | 9/2005 | Budell et al. | 439/71 |
| 7,117,469 B1 | 10/2006 | Dahl | |
| 7,214,886 B2 | 5/2007 | Audet et al. | |
| 7,275,229 B2 | 9/2007 | Bittner et al. | |
| 7,317,622 B2 | 1/2008 | Li | |
| 7,355,863 B2 | 4/2008 | Suzuki et al. | |
| 7,405,947 B1 | 7/2008 | Goergen | |
| 7,725,860 B1 | 5/2010 | Kwong et al. | |
| 7,757,196 B2 | 7/2010 | Bird et al. | |
| 2003/0135981 A1 * | 7/2003 | Galyean | 29/597 |
| 2004/0120128 A1 | 6/2004 | Chang | |
| 2005/0029632 A1 | 2/2005 | McKinzie, III et al. | |
| 2005/0050505 A1 * | 3/2005 | Bednar et al. | 716/12 |

(Continued)

OTHER PUBLICATIONS

PCT International Search Report dated Aug. 7, 2008.

(Continued)

*Primary Examiner* — Derris H Banks
*Assistant Examiner* — Tai Nguyen
(74) *Attorney, Agent, or Firm* — Patterson & Sheridan, LLP

(57) ABSTRACT

Techniques for optimizing application specific integrated circuit (ASIC) and other IC pin assignment corresponding to a high density interconnect (HDI) printed circuit board (PCB) layout are provided. Applying the techniques described herein, pin assignments may be systematically and strategically planned, for example, in an effort to reduce the PCB layer count and associated cost, increase signal integrity and speed, reduce the surface area used by an ASIC and its support circuitry, reduce plane perforations, and reduce via crosstalk when compared to conventional designs with an ASIC mounted on a multilayered PCB.

17 Claims, 29 Drawing Sheets

U.S. PATENT DOCUMENTS

2005/0093133 A1    5/2005  Kawasaki et al.
2005/0201715 A1    9/2005  Ellwood, Jr.
2006/0097370 A1    5/2006  Bartley et al.
2008/0245557 A1   10/2008  Bird et al.
2009/0070727 A1    3/2009  Solomon

OTHER PUBLICATIONS

Fong, Ryan J. L., "Improving Field-Programmable Gate Array Scaling Through Wire Emulation", Thesis submitted to the Faculty of the Virginia Polytechnic Institute and State University, Sep. 3, 2004, Blacksburg, VA, US.

Office Action history of patented U.S. Appl. No. 11/696,666, dates ranging from Apr. 6, 2009 to Mar. 9, 2010.

Office Action history of pending U.S. Appl. No. 11/837,322, dates ranging from Aug. 10, 2010 to Feb. 17, 2011.

PCT International Search Report dated Aug. 27, 2008 for International Application No. PCT/US 08/59200.

* cited by examiner

170

170

170

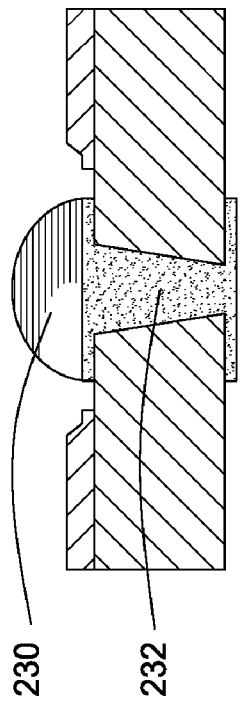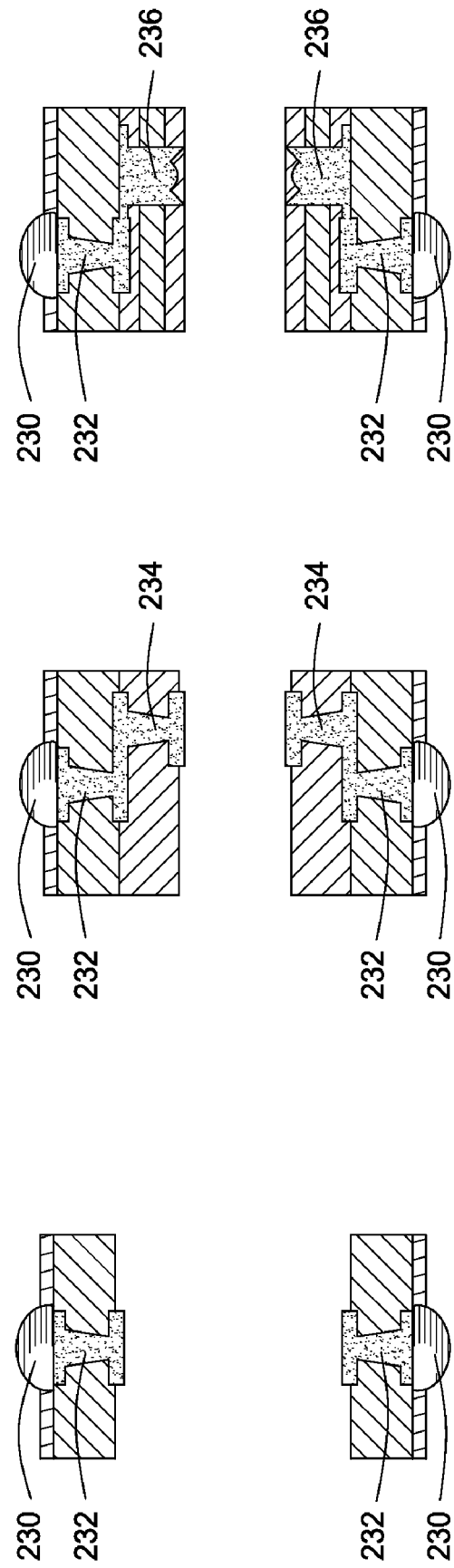

DO

DON'T

CONNECTION AN INTEGRATED CIRCUIT ON A SURFACE LAYER OF A PRINTED CIRCUIT BOARD

BACKGROUND OF THE INVENTION

1. Field of the Invention

Embodiments of the present invention generally relate to integrated circuits (ICs) and multilayer printed circuit boards (PCBs).

2. Description of the Related Art

As processing applications become increasingly more complex, the number of input/output (I/O) pins, configuration pins, and other types of pins of ICs required for power and to interface with other components continues to grow. It is not uncommon for some application-specific ICs (ASICs) to possess pin counts that exceed 2000. Advancements in technology continually push the envelope to design smaller and smaller surface mount ASICs. Corresponding reductions in package size present a challenge to package designers faced with accommodating the increased pin count.

One approach to meeting the packaging requirements has been to encapsulate ASICs in a surface-mountable ball grid array (BGA). Using a grid of solder balls as its connectors, a BGA enables the package to be only slightly larger than the integrated circuit housed within. All of these trends towards increased functionality in an obligatory diminished package have led to very high density ASICs. However, properly connecting a high density BGA ASIC to a PCB to route signals and maintain signal integrity creates numerous problems for both the ASIC designers and the printed circuit board designers.

Accordingly, techniques for efficiently routing signals from high pin count ICs on multilayer PCBs are needed.

OVERVIEW

Embodiments of the present invention provide techniques for optimizing application specific integrated circuit (ASIC) and other integrated circuit (IC) pin assignment corresponding to a high density interconnect (HDI) printed circuit board (PCB) layout. Such techniques may be applied, for example, in an effort to increase signal integrity and speed, reduce the surface area used by an ASIC and/or its support circuitry, reduce the PCB layer count, reduce plane perforations, and/or reduce via-routed signal crosstalk when compared to conventional layout techniques.

One embodiment of the present invention provides a method. The method generally includes dividing an array of connections of an interface for an IC on a surface layer of a PCB; and coupling an interconnect to substantially all of the connections of each respective concentric ring to form a substantially pyramidal escape profile for the interface. Interconnects coupled to connections of outer concentric rings are generally routed away from (escape) the interface on shallower layers of the PCB than interconnects coupled to connections of inner concentric rings.

Another embodiment of the present invention provides a method of escaping from an interface having an array of connections for an IC on a surface layer of a PCB. The method generally includes dividing the array of connections into a plurality of concentric rings organized into first, second, and third ring groups; providing a blind µVia for each of the connections of the first ring group at the periphery of the array; providing a blind µVia coupled to a buried µVia for each of the connections of the second ring group adjacent to and inside the first ring group; and providing a blind µVia coupled to a subcomposite via for each of the connections of the third ring group adjacent to and inside the second ring group.

Another embodiment of the present invention provides a PCB with interconnections routed in accordance with techniques described herein. The PCB generally includes an interface for an IC, the interface disposed on a surface layer of the PCB; and a plurality of interconnects coupled to the interface to form a substantially pyramidal escape profile for the interface, wherein interconnects coupled to a periphery of the interface generally escape from the interface on shallower layers of the PCB than interconnects coupled to an interior of the interface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 19 is an example cross-sectional view of a test point for a μVia using a solder dome;

FIGS. 20A-C are example cross-sectional views of test probes for accessing different PCB layers;

DESCRIPTION OF EXAMPLE EMBODIMENTS

Figure 1:
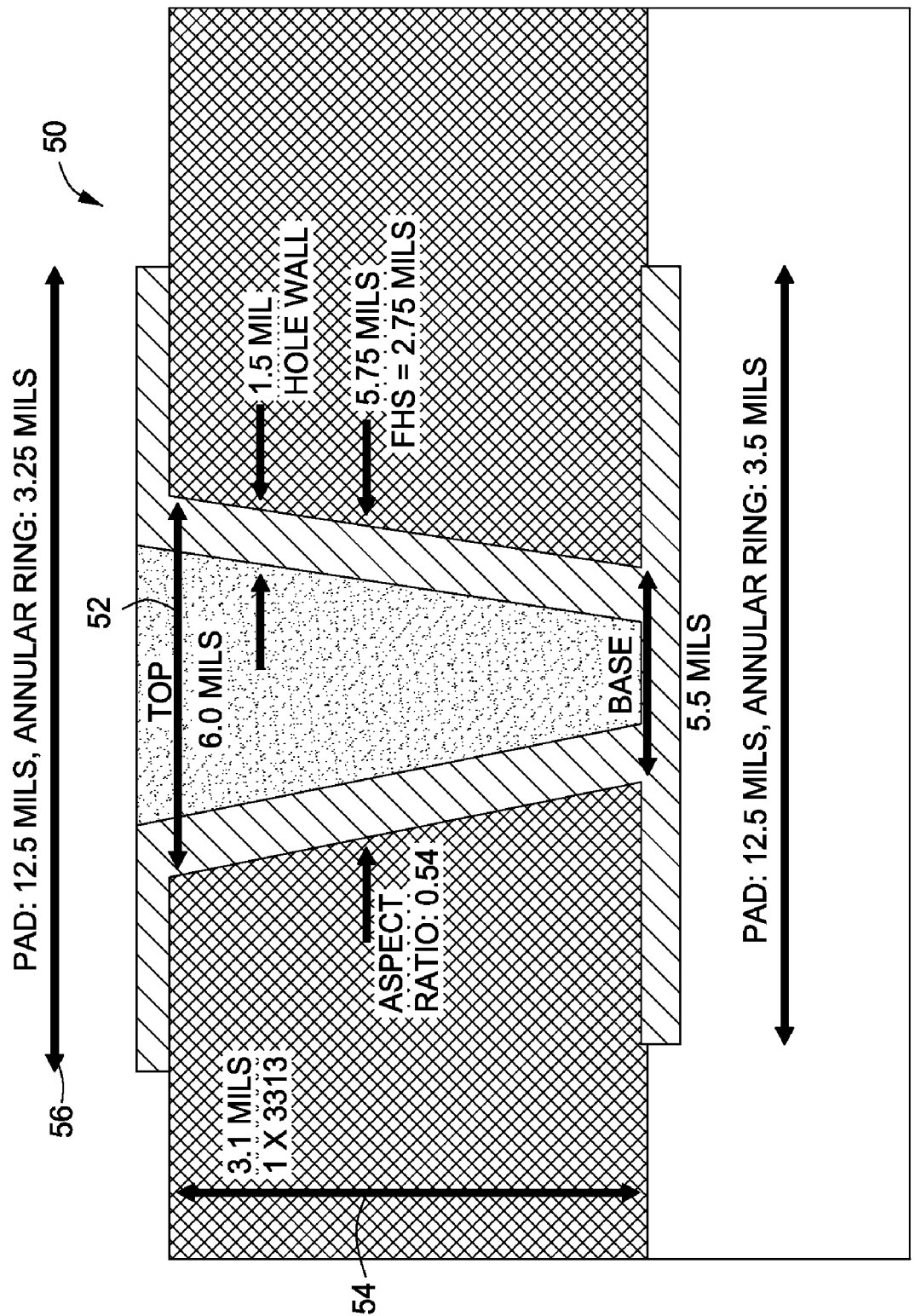
FIG. 1 illustrates an example cross-sectional view of a microvia (µVia)

Embodiments of the present invention provide techniques for optimizing application specific integrated circuit (ASIC) and other IC pin assignment corresponding to a high density interconnect (HDI) printed circuit board (PCB) layout. Applying the techniques described herein, pin assignments may be systematically and strategically planned, for example, in an effort to reduce the PCB layer count and associated cost, increase signal integrity and speed, reduce the surface area used by an ASIC and its support circuitry, reduce plane perforations, and reduce via crosstalk over conventional designs with an ASIC mounted on a multilayered PCB.

Many of the techniques described herein may be applied to any integrated circuit (IC). To facilitate understanding and since board developers interested in these techniques may have the most control over custom ASIC pin assignments, the techniques are described in relation to ASICs as a specific example.

PCBs with multiple layers are typically used for routing signals between very dense surface-mount packages and other electronic components. While the number of layers of a PCB is theoretically unlimited, manufacturing costs typically increase and yields typically decrease with increased layer counts. Furthermore, a high layer count may be problematic when routing high speed electrical signals in a PCB, primarily due to the properties of electrically conductive vias used to vertically connect traces routed on different layers using conventional plated through-hole (PTH) technology. These vias routed from one side of the board to the other possess intrinsic parasitic resistance, capacitance, and inductance, which can lower the bandwidth of a signal routed with one or more vias and may also introduce unwanted reflections. Further, despite their small size, these vias can act like short antennas, large enough to couple in high frequency noise.

Despite these problems, the sheer number of pins and the pitch of conventional BGA ASICs demands that vias be used to route nets away from the BGA pins to other board layers. With respect to an ASIC and as used herein, a net generally refers to an individual signal path including all of its branches and extensions.

Because PCB vias cannot be placed directly underneath a BGA pin with plated through-hole (PTH) technology, a "dog bone" via is typically inserted for every pad corresponding to a pin of the ASIC BGA package that requires internal routing, whether it is a signal pin, a power pin, or a ground pin. As used herein, a dog bone via generally refers to a PTH via coupled to a surface mount component pad by a short trace and having a shape on a PCB surface layer similar to a dog bone or barbell. The resulting "escape profile" is a full matrix of vias that travel through all or most layers of the PCB. As used herein, the term "escape profile" generally refers to the shape of the traces and interconnects, such as vias, used to route signals away from surface layer connection pads of a surface mount component to other layers of a PCB. This conventional full matrix approach is very wasteful of space since an ASIC pin generally only needs access to one or two other layers, but the via blocks routing signal and power nets on all remaining layers.

Further, the conventional escape profile underneath dense ASIC packages typically causes the planes to be substantially broken up by the vias and the associated planar keep-outs encircling the vias (i.e., perforated). Perforating a power or ground plane reduces its effectiveness as a shield against high frequency noise. In addition, return loops that potentially pick up noise can be created when a signal trace on a different layer crosses a substantial break in a return plane.

Many full-custom ASICs may be designed by simply grouping nets together based on function and/or logic voltage and then assigning the nets within such a group to neighboring pins. For high speed designs, critical nets, such as clock traces or time-sensitive nets where jitter may be a concern, may be assigned cautiously within a grouping and affixed to certain pins. The remainder of the ASIC pin assignments may be completed somewhat haphazardly, whether done by automated tools or manually, even if further grouping of the nets is performed. Oftentimes, this practice leads to PCB layouts that are deep and narrow as circuit board developers try to escape nets from the ASIC that have been physically grouped together and most likely need to connect to different locations.

Introduction of Example HDI Components

To facilitate understanding of the techniques presented herein, it may be beneficial to first introduce some high density interconnect (HDI) components that may be used in conjunction with the techniques presented herein.

One HDI component is commonly referred to as a microvia, μ-via, or μVia. FIG. 1 is a cross sectional view of a typical μVia 50 with dimensions provided by Ibiden. As used herein, a μVia generally refers to a blind or buried via with a finished hole size (FHS) 52 typically in the range of 3 to 6 mils (1 mil=0.001 inch). A μVia may be formed by a variety of techniques, including laser ablation, photo definition, plasma etching, or micro-mechanical drilling to have a depth 54, for example, of approximately 3.1 mils. Unlike a plated through-hole (PTH) via, which may have a relatively large pad diameter (e.g., of 25 mils or greater), a μVia may have a significantly smaller pad diameter 56 (e.g., of 12.5 mils or less), thereby allowing for denser routing strategies and/or denser integrated circuit (IC) pin pitch. A μVia may be placed in a component pad, and in such a case, the top of a μVia at the surface layer may be "tented" by some manufacturers to push through the solder mask. Despite its smaller size, a single μVia may be rated to carry a DC current of up to 2 A.

Figure 2:
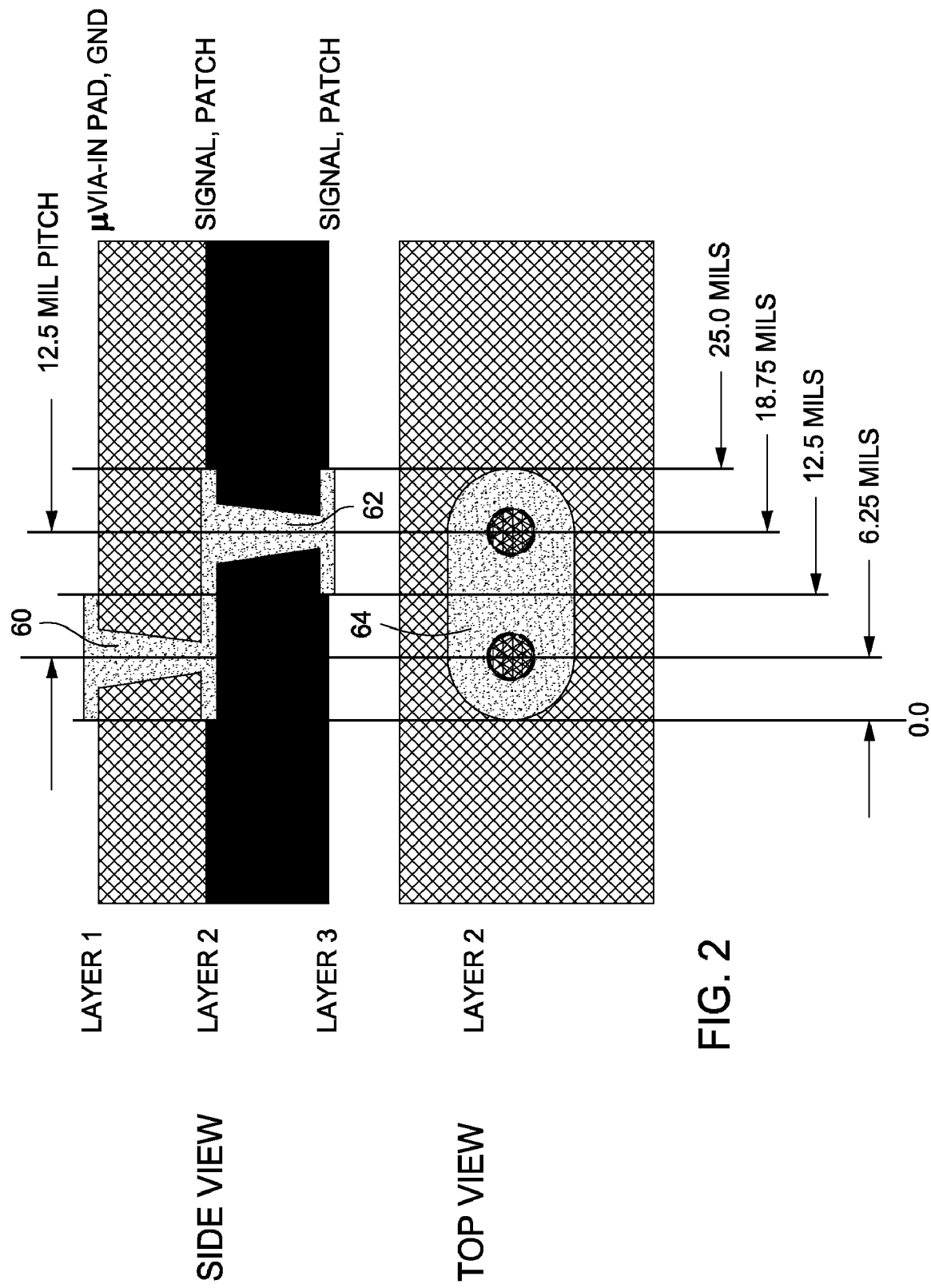
FIG. 2 illustrates example cross-sectional and top views of a µVia structure to access an inner PCB layer below or above a surface layer.

Referring now to FIG. 2, a blind μVia 60 may be combined with a buried μVia 62 to access an internal PCB layer two layers below (layer 3) or above (layer n−2) a surface layer and form what may be called a micro-"dog bone" 64 on an internal layer (layer 2 or layer n−1). On an internal layer one layer below a top layer (layer 2) or one layer above a bottom layer (layer n−1), the annular rings of the μVias 60,62 may be electrically connected with a trace having the same or a substantially similar width. As an example, μVias 60,62 having a 12.5 mil pad diameter may be electrically connected with a 12.5 mil wide trace, forming a 12.5 mil by 25 mil obround pad, the micro-dog bone 64, when viewed from the top, as illustrated in FIG. 2.

Figure 3:
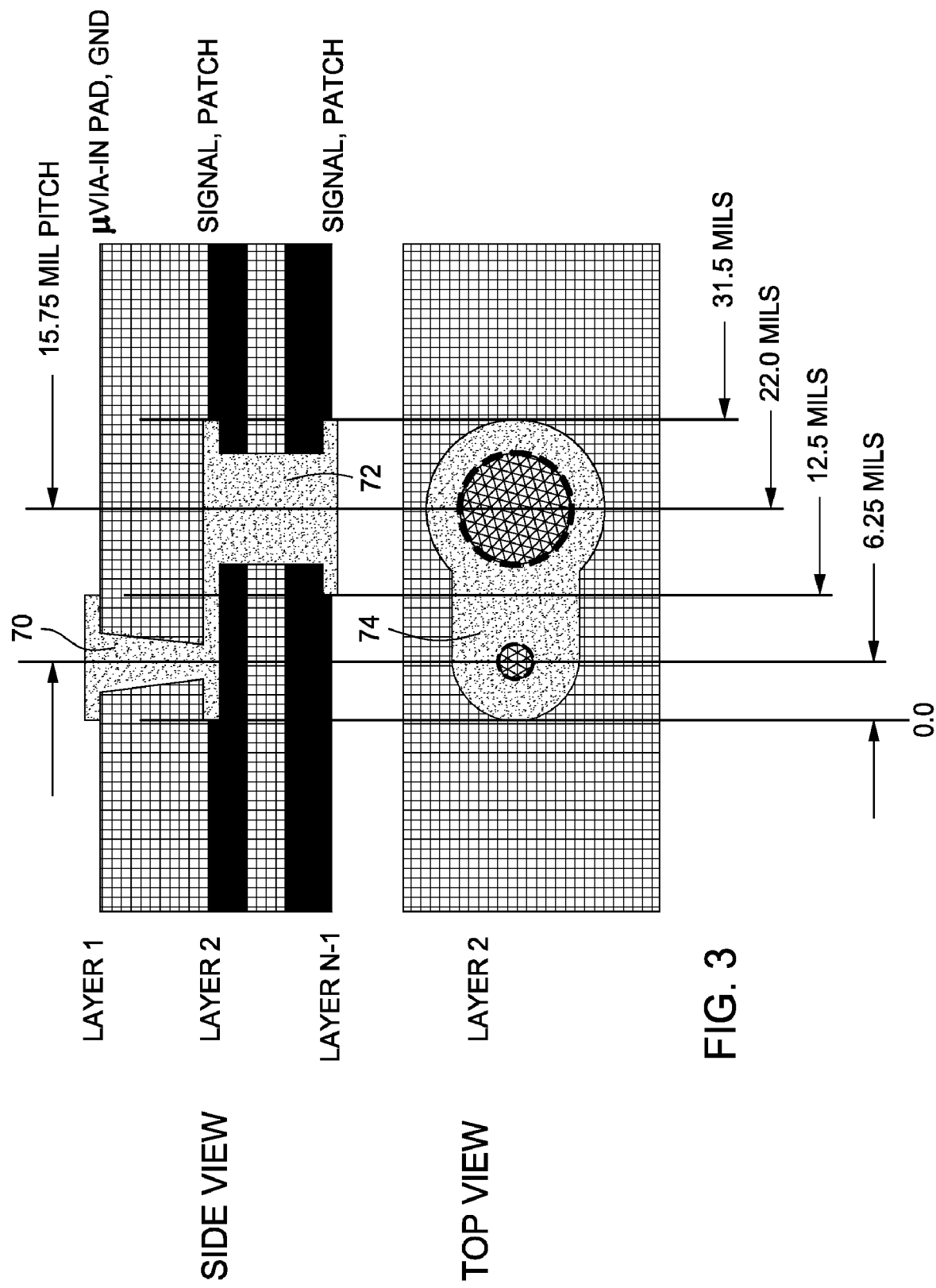
FIG. 3 illustrates example cross-sectional and top views of a µVia combined with a subcomposite via to access an inner PCB layer more than one layer below or above a surface layer.

In order to access layers other than the surface layers (layers 1 or n) and an internal layer one layer below (layer 2) or above (layer n−1), in FIG. 3 a blind μVia 70 may be combined with a subcomposite, or sub-laminar, via 72. The subcomposite via 72 is similar to a buried PTH via except that the subcomposite via 72 may have a smaller diameter and commonly extends from layer 2 to layer n−1. On an internal layer (e.g., layer 2 or layer n−1), the annular rings of the μVia 70 and the subcomposite via 72 may be connected with a trace having a width substantially equal to the μVia pad diameter. For example, a μVia with a 12.5 mil pad diameter may be electrically connected to a subcomposite via with a pad diameter of 31.5 mils by a 12.5 mil wide trace, thereby forming a 12.5 mil by 31.5 mil "keyhole" pad 74 when viewed from the top as portrayed in FIG. 3.

Figure 4:
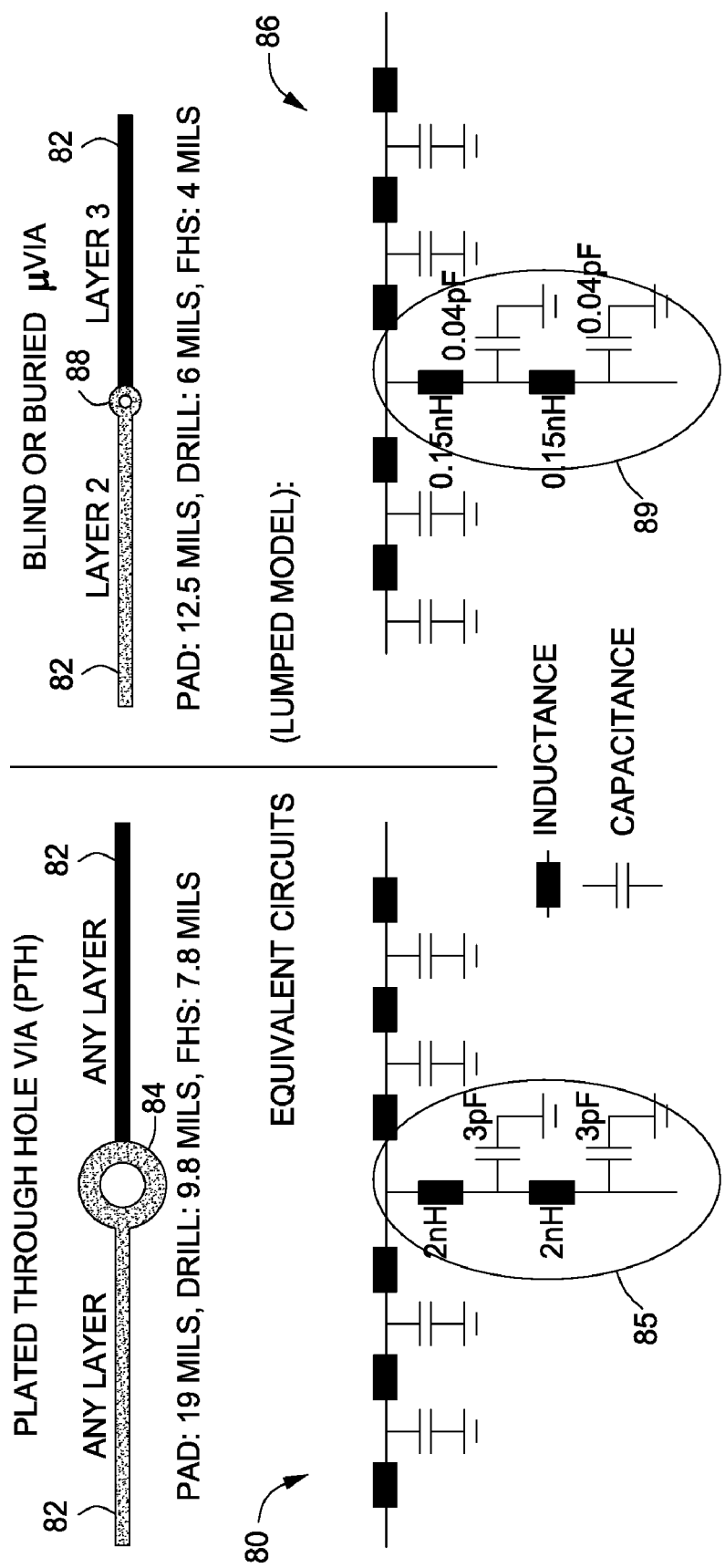
FIGS. 4A-B illustrate example lumped parameter models of a PTH via and a µVia.

Not only do the components of HDI technology use less real estate than those of conventional PTH technology, but they may also have less electrical parasitics (i.e., inductance, capacitance, and resistance whose values depend solely on the dimensions of the via structure). These parasitics place an inherent limitation on how fast a signal can pass through the structure. This may be appreciated by contrasting circuits equivalent to traces connected by a PTH via and a μVia, where the representative circuits employ lumped parameter models of the PCB components. FIG. 4A is a lumped parameter model 80 of a trace 82 routed on two different layers and connected by a PTH via 84 with a 19 mil pad and a finished hole size (FHS) of 7.8 mils. The PTH via 84 may be modeled as a stub 85 with a series of 2 nH inductor and 3 pF capacitor elements of a transmission line. FIG. 4B, on the other hand, is a lumped parameter model 86 of a trace 82 routed on layers 2 and 3 and connected by a μVia 88. The μVia 88 may have dimensions as described above and illustrated in FIG. 1. Such a μVia 88 may be modeled as a stub 89 with a series of 0.15 nH inductor and 0.04 pF capacitor elements of a transmission line, and these parasitics are at least an order of magnitude smaller than those of the PTH via 84.

Figure 5:
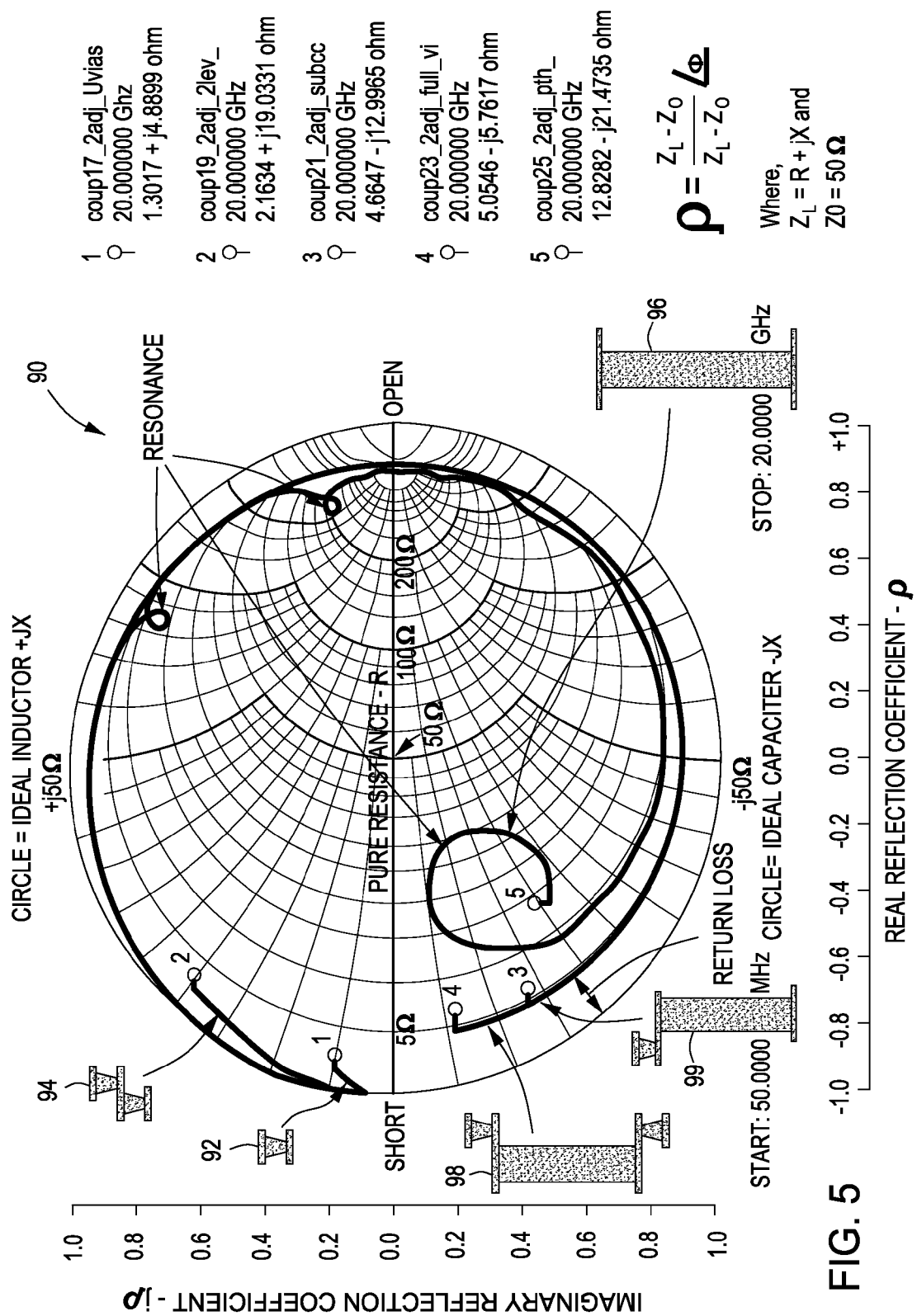
FIG. 5 illustrates an example Smith chart showing the reflection coefficients of a PTH via and combinations of µVias and subcomposite vias.

FIG. 5 is a Smith chart 90 with a characteristic impedance ($Z_o$) of 50Ω illustrating the reflection coefficients from 50 MHz to 20 GHz of a PTH via and combinations of μVias and subcomposite vias. Whereas a μVia 92 or a combination of μVias 94 may appear as a small inductance at high frequencies approaching 20 GHz with almost negligible return loss, a PTH via 96 may switch between being mostly inductive to mostly capacitive in nature as it approaches 20 GHz. The PTH via 96 may have a much higher return loss and may resonate at several points in the frequency sweep, finally being overwhelmed by the parasitics around 17 GHz. Although combinations 98, 99 of a subcomposite via with one or two μVias may switch from being mostly inductive to mostly capacitive in nature similar to the PTH via 96 as the frequency is increased from 50 MHz to 20 GHz, the HDI combinations 98, 99 may have a lower return loss at high frequencies and may not resonate.

Figure 6A:
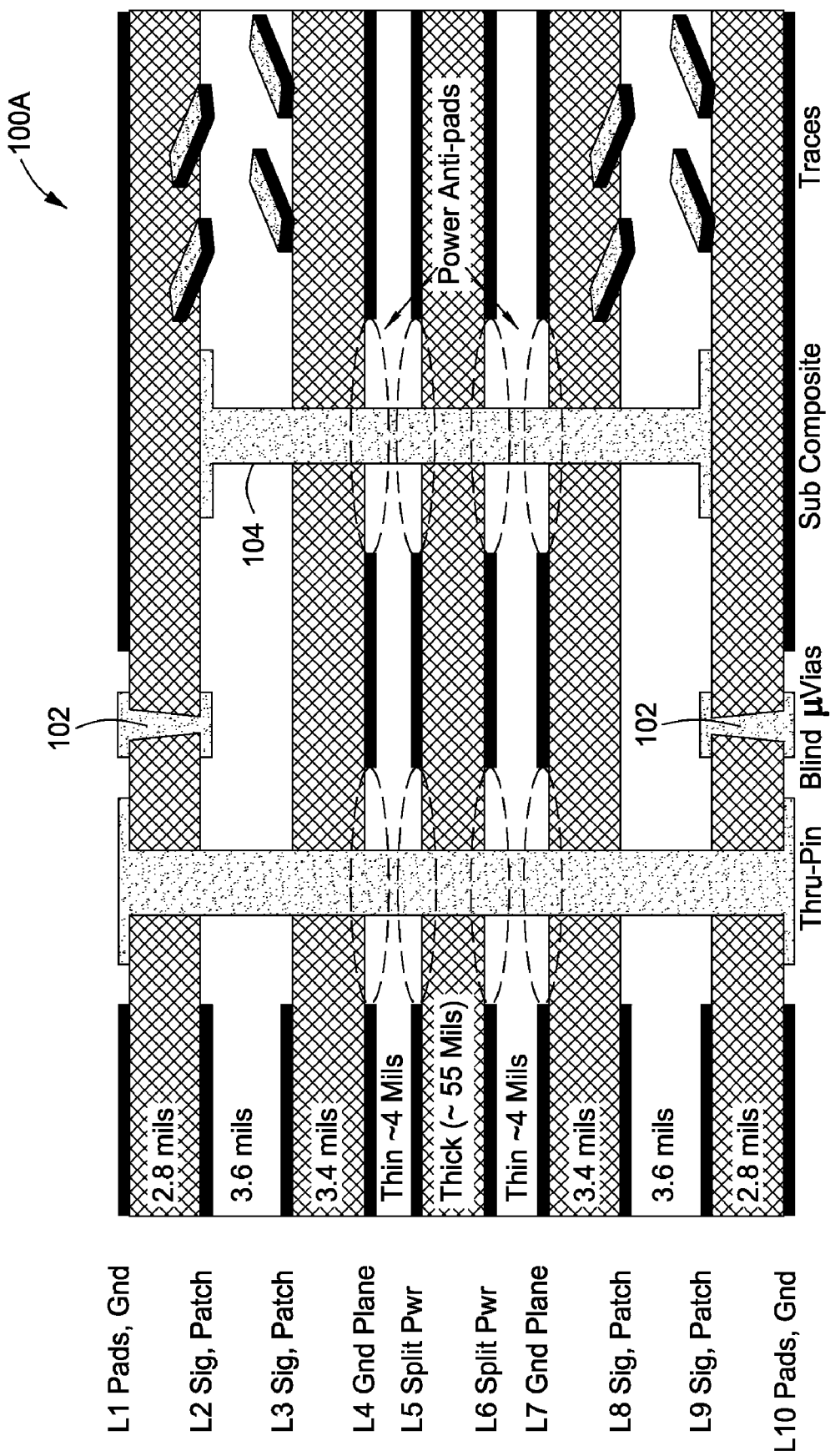
FIGS. 6A-C illustrate example PCB stackups using combinations of µVias, subcomposite vias, and buried via core (BVC) vias.
Figure 6B:
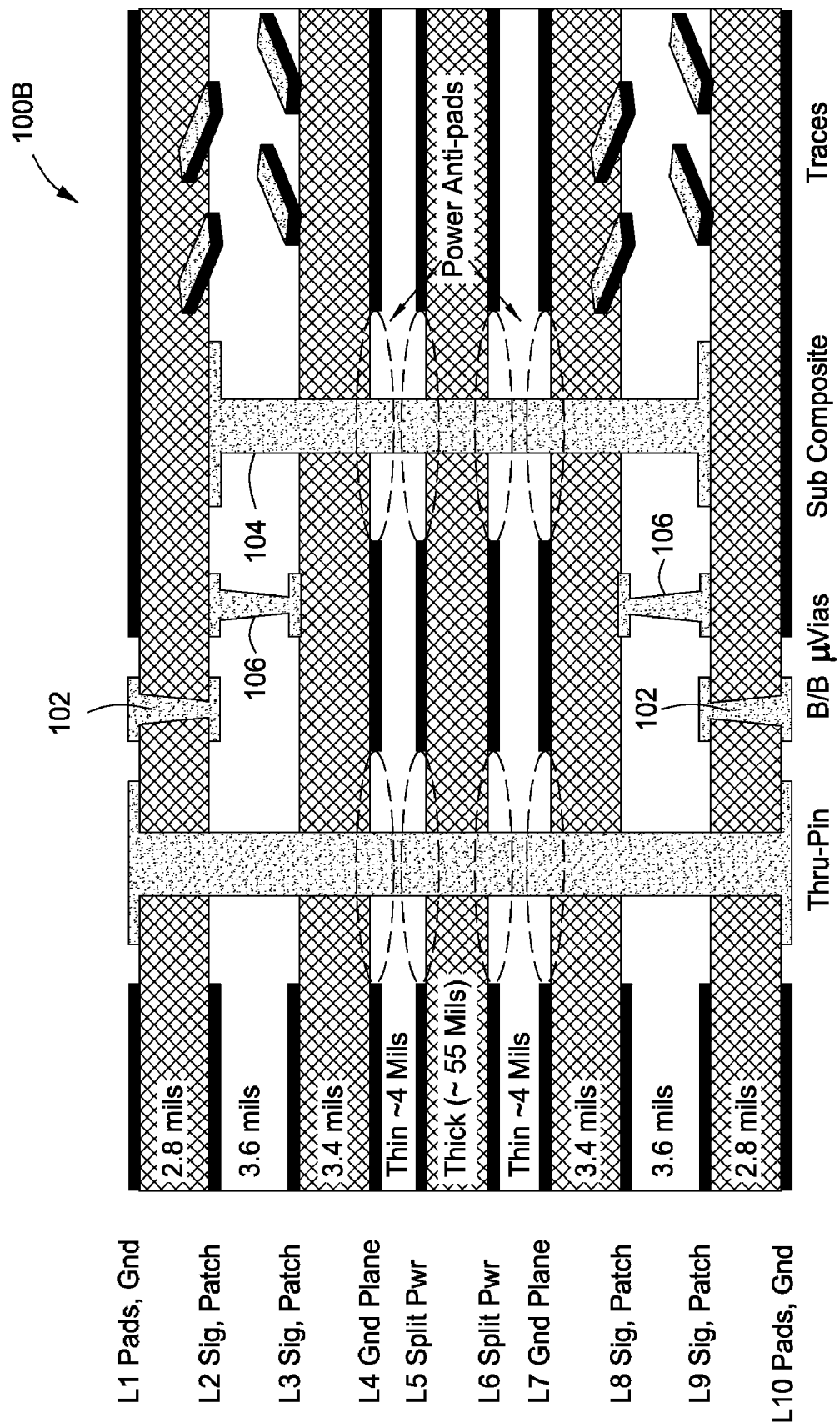
Figure 6C:
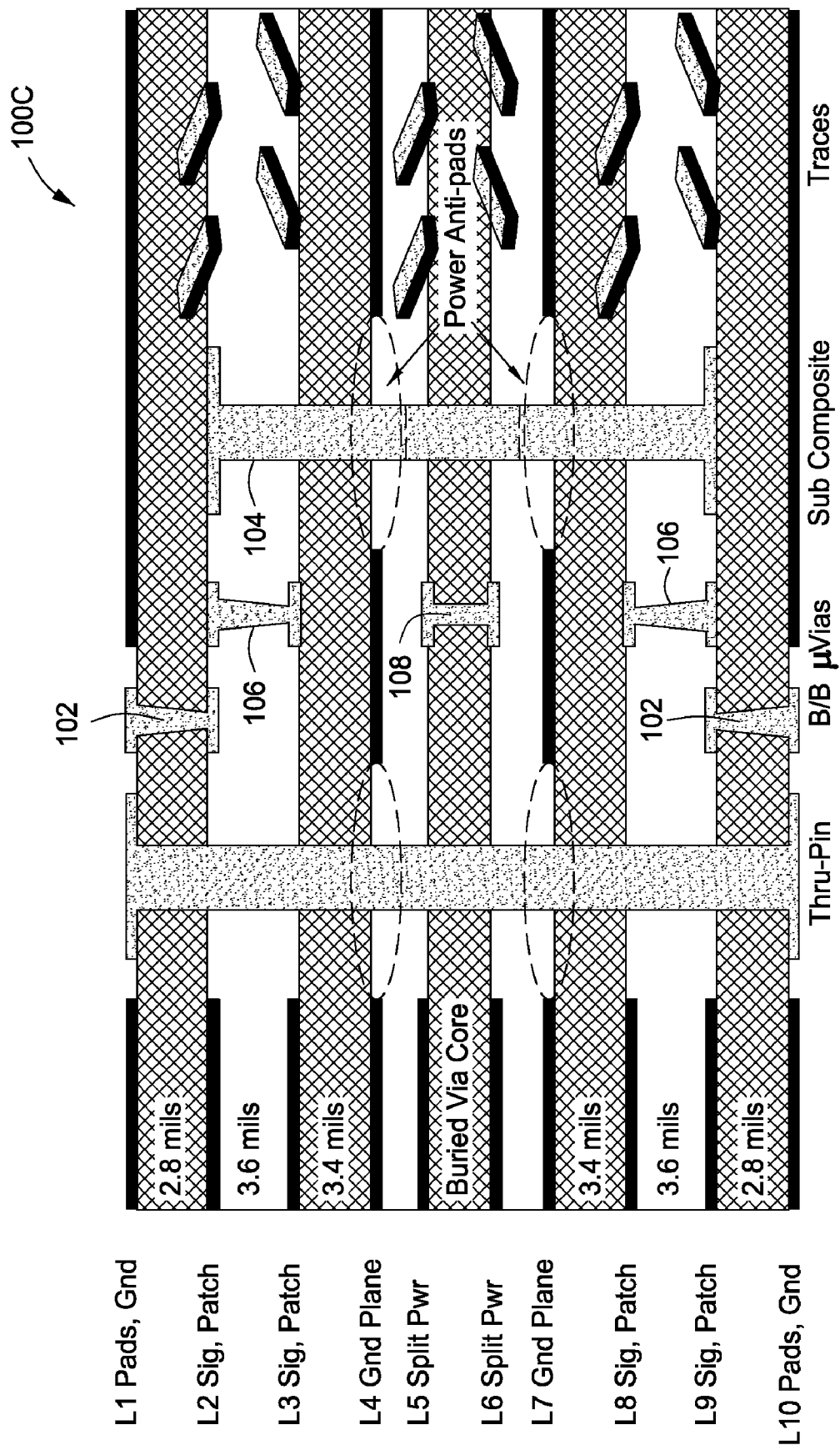

Combinations of μVias, subcomposite vias, and buried via core (BVC) vias may be used to route nets of a PCB, especially when escaping a high speed or dense ASIC. FIGS. 6A-C are examples of 10-layer PCB stackups 100A,100B, 100C using HDI technology. For a 10-layer stackup 100A, 100B,100C, some embodiments may use blind μVias 102 to connect layers 1 and 2 and layers 9 and 10. Some embodiments may access layers 3 through 8 with subcomposite vias 104. Referring to FIG. 6B, other embodiments may also connect layers 2 and 3 and layers 8 and 9 with buried μVias 106. Referring now to FIG. 6C, some embodiments may also make use of BVC vias 108 to route between adjacent internal layers. In all of the example stickups 100A, 100B, 100C, the surface layers 1 and 10 may be ground planes as shown in an effort to form a Faraday cage and shield the PCB from electrical noise.

Utilizing HDI components in a strategic manner (e.g., in the manner of the example stackups above) may allow a PCB designer to surpass the inherent density limitation imposed on ball grid array (BGA) packages when used in conjunction with PTH technology. In other words, the small pad diameter of μVias may allow for traces to be routed on a surface layer where an ASIC makes contact with the PCB, which may not be possible with traditional PTH "dog bone" vias. The smaller pad diameter on internal layers may also permit more traces to be routed on internal layers in comparison to conventional PTH vias (due to the larger internal keepout diameter of PTH vias).

However, the use of HDI technology alone may not be enough to route escapes from a large pin count ASIC, especially one with a pin pitch of 0.8 mm. Simply converting a PTH PCB to use HDI technology may have some minor impact on the layer count, the crosstalk, the signal speed and integrity, or the plane perforations of the PCB. However, further optimizations in HDI layout may be desired in an effort to achieve greater circuit performance according to embodiments of the invention.

An Example ASIC Pinout and Corresponding PCB Layout

Strategically planning the pin assignments, or the pinout, of an IC having a high pin density, such as a custom ASIC, in accordance with embodiments of the invention to correspond to a deliberately planned PCB layout utilizing HDI technology may provide improvements in some or all of these areas: PCB layer count, crosstalk, signal speed and integrity, and PCB plane perforations.

Figure 7:
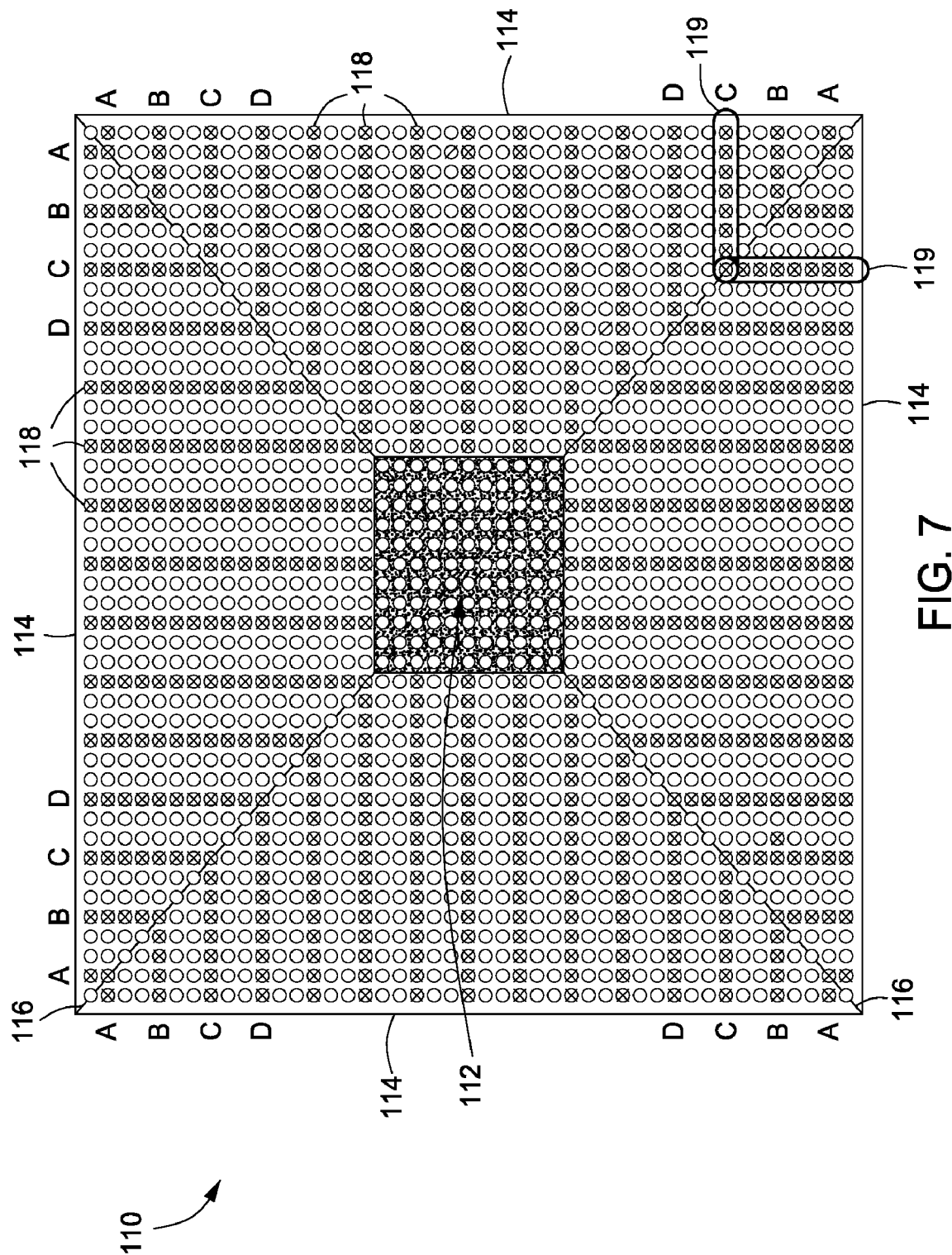
FIG. 7 illustrates an example ASIC pin assignment of power core and L-shaped ground pins.

An initial part of a pinout strategy may be to assign all of the power pins (assuming that the number required is already known) to the middle of the ASIC as shown in FIG. 7. These DC voltage power pins, having supply voltages such as 1.5 V, 1.8 V, 2.5 V, 3.3 V, and 5.0 V, may compose a power core 112 for the custom ASIC 110. The power core 112 may also contain some ground pins for connecting to internal ground plane layers depending on the desired PCB layer stackup. Although shown as a square in the figure, the power core 112 may assume any shape, such as a circle, oval, ellipse, rectangle, diamond, cross, or generally shapeless structure. Whatever shape the power core 112 assumes, the power voltages may be assigned to adjacent pins aggregated near the center of the ASIC 110, for reasons that will be explained below.

Because the most efficient escape pattern may have traces extending radially outward from the center of the ASIC package, the custom ASIC 110 may be divided with imaginary lines 116 into quadrants 114 denoting in which general direction traces should be routed. Functioning simply as guidelines, the imaginary lines 116 may not have to extend from corner to corner of the ASIC 110, but may extend between the middles of opposing edges or in other manners of dividing the ASIC 110 into four parts. In fact, those skilled in the art may recognize that the ASIC 110 may be divided into fewer or more parts than four. For example, dividing the ASIC into eight parts may also be suitable for some applications since many computer-aided design (CAD) layout tools allow for traces to be routed in eight different directions. However, to aid in describing the optimization of an ASIC pinout, the remainder of the discussion will focus on an ASIC divided into four quadrants 114 as shown in FIG. 7.

Based on the quadrants 114, another part of the pinout strategy may be to assign pins as ground or the reference voltage for the ASIC in an "L-shaped" pattern as illustrated in FIG. 7. These grounds in an L-shaped pattern 118 may extend from the imaginary lines 116 to the edge of the ASIC 110 except in the power core 112. By spacing the grounds in an L-shaped pattern 118 every three ASIC pins (i.e., where two rows or two columns of non-ground pins reside between the L-shaped ground extensions), every ASIC pin outside of the power core 112 should be adjacent to a ground pin. In the power core 112, the pins should remain as assigned to power voltages and any desired grounds. In this manner, each non-ground signal pin may be adjacent to a return (i.e., ground) pin, thereby minimizing the loop area of the signal and its return path at the ASIC pin level and hence, the amount of magnetic coupling at this level. In addition, as will be explained in further detail below, the legs 119 of the grounds in an L-shaped pattern 118 provide lanes on inner layers of the PCB in which to route escapes from the ASIC 110.

There may be problems when assigning pins to the ASIC 110 with the goal of creating grounds in an L-shaped pattern 118 while maintaining a non-ground signal pin adjacency. For instance, in ASIC packages that are not square as far as the pins are concerned, one leg 119 of an L-shaped ground 118 may have to be assigned with more or less than the ideal two rows or two columns of non-ground pins next to it. The imaginary lines 116 may be used as guidelines such that the legs 119 of the grounds in an L-shaped pattern 118 may extend from pins on or near the imaginary lines 116 to pins at the edge of the ASIC 110. In an ASIC where the number of required non-ground signal and power pins exceeds the ability to assign pins to grounds in an L-shaped pattern 118 in keeping with the aforementioned goal, either the ASIC 110 may be developed in a larger package, or some of the pins of the grounds in an L-shaped pattern 118 may be converted to signal pins. This conversion may start in the periphery of the ASIC 110. For example, pins of L-shaped ground patterns A may be converted to signal pins before pins of L-shaped ground patterns B, and so on. By converting pins of potential grounds in an L-shaped pattern 118 in the periphery of the ASIC 110 first, the ability to route escapes away from the ASIC 110 may remain higher than if pins of potential grounds in an L-shaped pattern 118 near the power core 112 were converted.

In regards to the PCB layout corresponding to the ASIC 110, both the top and bottom layers of the PCB may be ground plane, at least in the area of the ASIC, if not the entire board. Having ground planes on the surface layers may prevent high frequency electrical noise from interfering with the traces associated with the ASIC 110 and other electrical components, and it may also prevent these components from radiating electrical noise to other boards. In order to complete the Faraday cage construction having ground planes for a top and a bottom, ground stitching with PTH vias or a combination of μVias and subcomposite vias may be used at the edges of the PCB to form the sides of the PCB, depending on the size of the board and/or the frequency of the signals the PCB developer may want to keep contained or prevent from interfering. The spacing of the ground stitching vias should be no farther apart than a quarter of the wavelength of the highest frequency signal the PCB designer wishes to prevent from crossing the Faraday cage.

There may be other advantages to using a ground plane on a surface layer adjacent to the ASIC. For example, one advantage may be that none of the ground pins of the ASIC need a via in the PCB because these pins can be connected directly with the surface layer ground plane. Since a large portion of the pins of most ASICs are ground pins, this strategy may save a lot of real estate in the ASIC pin field traditionally allocated for ground vias and may also preclude ground anti-pad perforations in internal planes.

Figure 8:
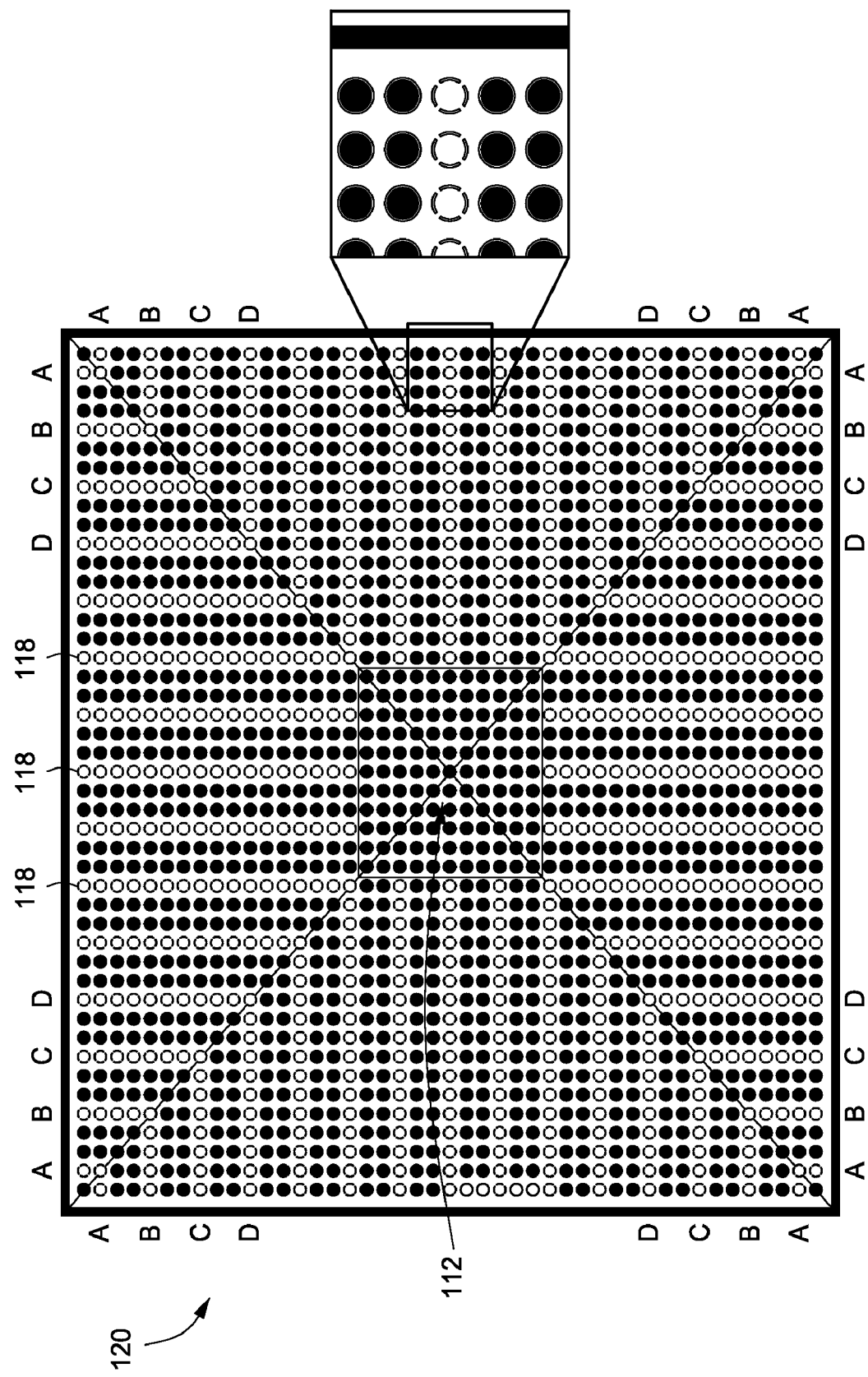
FIG. 8 illustrates an example surface layer ground plane using the pin assignments of FIG. 7.

FIG. 8 illustrates a surface layer ground plane 120 using the pin assignments of FIG. 7 depicting the flooding of the grounds in an L-shaped pattern 118 according to some embodiments. Without any ground vias, the shape of the grounds in an L-shaped pattern 118 may be conceptually projected onto all internal layers to be corridors of open space. These empty corridors without vias or associated keepouts may be strategically and systematically used to route escapes from the ASIC pin field. The empty corridors on internal layers may also allow for wide power strips on the power plane layers for improved power delivery from the edge of the ASIC pin field to the power core 112 because of the reduced inductance of wider traces or planes. Furthermore, by using μVias either within the ASIC pad (i.e., μVia-in-pad) or with a skinny trace between the smaller pad diameter of the μVia and the ASIC pad instead of PTH "dog bone" vias, the surface layer ground plane may fill in more of the area in the ASIC pin field and provide more shielding coverage.

Figure 9:
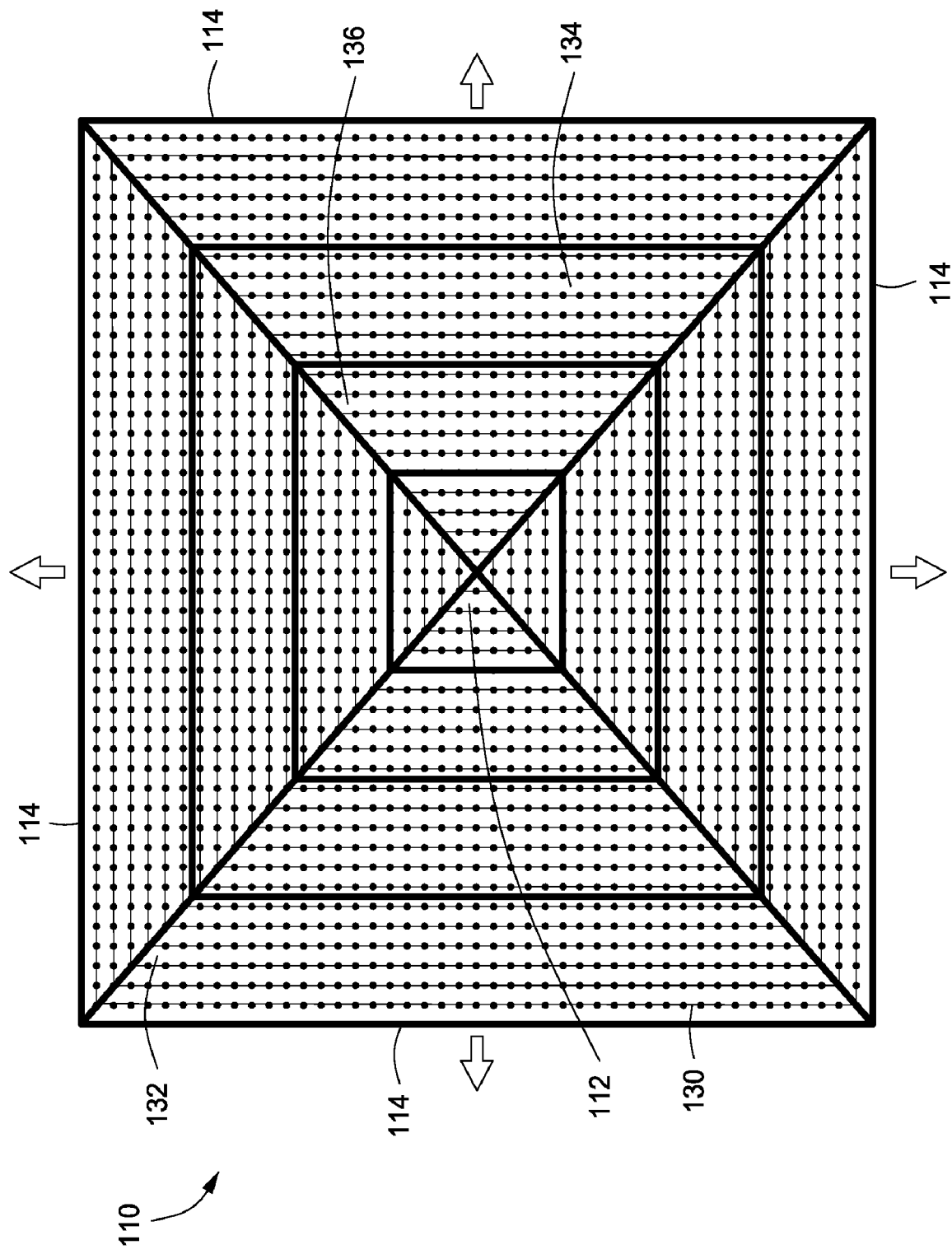
FIG. 9 illustrates an example ASIC pin assignment with the division of the ASIC into rings and quadrants.

Referring now to FIG. 9, another part of an ASIC pinout strategy may be to divide the ASIC pins into rings 130 and cluster the rings 130 into ring groups 132, 134, 136. Each ring group 132, 134, 136 may represent all of the pins in the rings 130 where signal routes may escape the ASIC on a particular PCB layer. Thus, the number of pins (and rings 130) in each ring group 132, 134, 136 may be determined by the number of possible traces that may be routed away from the ASIC on a particular layer. For example, the outermost ring group 132 in FIG. 9 contains six rings 130 of pins. Although only three ring groups 132, 134, 136 with seventeen rings 130 are collectively shown in FIG. 9, those skilled in the art will recognize that the number of ring groups may also depend on the number of ASIC pins, the pin pitch, the minimum spacing between traces, and the minimum trace width that can be manufactured with an acceptable yield.

With an ASIC usually being the densest component on the board, the number of rings required may dictate the PCB layer count. Thus, by knowing the number of rings, as well as the number of desired ground and power plane layers, the PCB designer may begin the layout process knowing the correct number of layers required to successfully route the PCB from the start. Traditionally, designers have had to make a guess at the layer count based on experience, which may have led to increased design time when the estimated layer count was too low and some of the nets had to be rerouted or to a needlessly overpriced board when the estimate was too high and the layout was inefficient. Accurately predicting the layer count may be a significant contributor to efficient board layout.

Figure 10A:
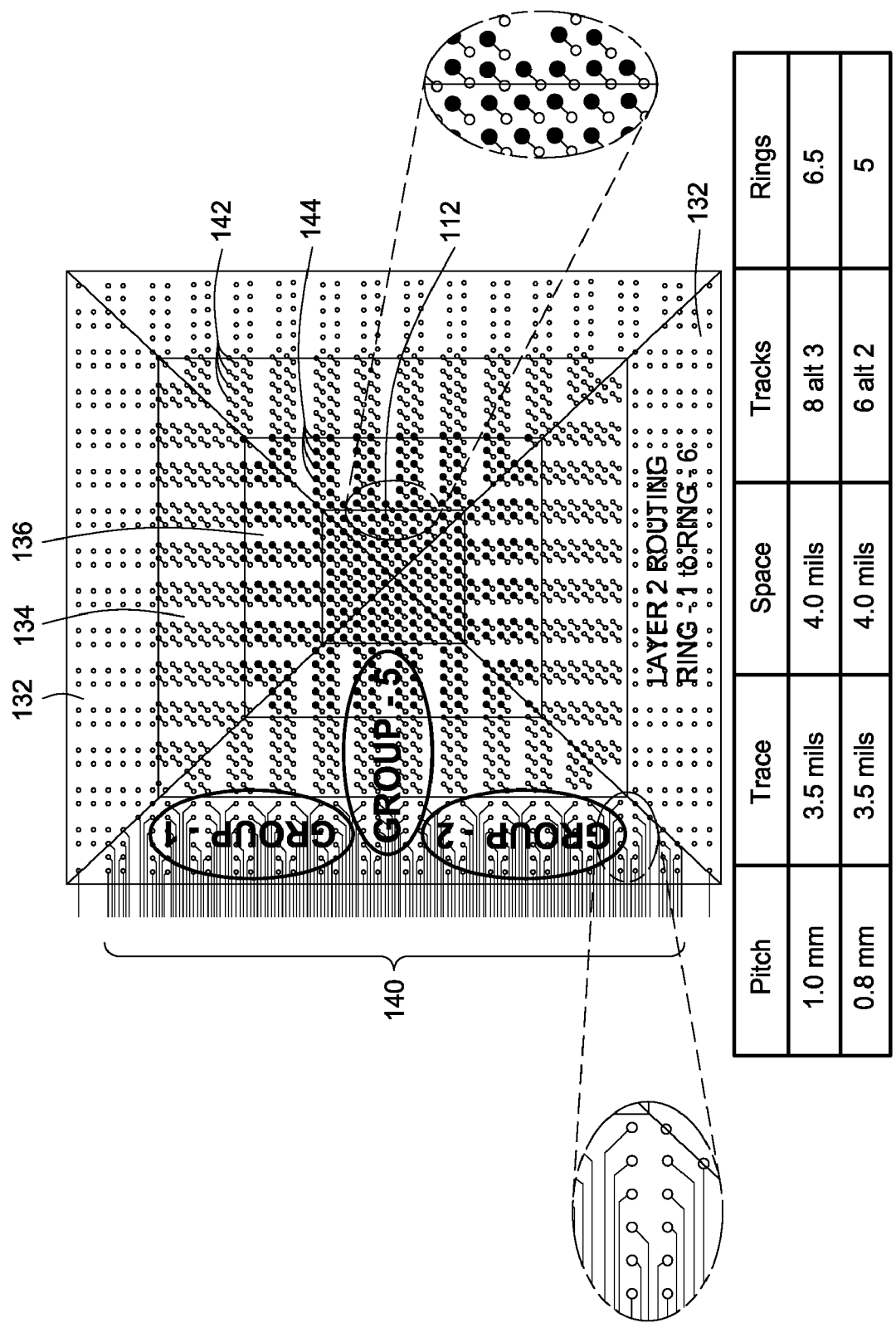
FIGS. 10A and 10B illustrate example layouts for a portion of an ASIC illustrating how nets may be routed to escape the ASIC by rings and quadrants.

According to embodiments of the invention, the outermost ring group 132 may contain rings 130 of pins to be routed on the most shallow internal layer (e.g., layer 2 or layer n−1) of the PCB as shown in the example layer 2 routing of FIG. 10A.

To route signals of the outermost ring group 132 from the pads on layer 1 (or layer n) to layer 2 (or layer n−1), blind µVias may be used. These µVias may reside in the pad for some embodiments. The traces 140 may be routed in the corridors of empty space created by the absence of the grounds in an L-shaped pattern 118 on this internal layer. For some embodiments, assuming a 1.0 mm pitch, 3.5 mil trace widths, and 4.0 mil spacing, eight traces 140 may be routed in the general direction of the quadrant 114 in the corridor of empty space, while three traces 140 may be routed between µVia pads bounding two adjacent empty corridors as shown. The combined use of strategies described herein may permit the transition to 0.8 mm ASIC pin pitch packages, which would decrease the surface real estate by 36%, allowing for denser board layouts and potentially, more boards per PCB panel, thereby reducing cost. In such embodiments with 0.8 mm BGA pitch, six traces may be routed in the corridor of empty space, while two traces may be routed between µVia pads bounding two adjacent empty corridors.

Other types of HDI components may be used to route escapes from the ASIC pins to inner layers in the PCB stackup, and FIG. 10A shows some examples of this. For instance, the second outermost ring group 134 may use blind µVias to route between a surface layer (layer 1 or layer n) and the next layer inward (layer 2 or layer n−1), and then use buried µVias to route between this layer and a second inner layer (layer 3 or layer n−2). In FIG. 10A, evidence of this can be seen by the micro-"dog bone" vias 142 in the second outermost ring group 134. Moving inward, the next ring group 134 and other ring groups may use subcomposite vias to access inner layers from layer 2 or layer n−1. Evidence of this can be seen by the "keyhole" pads 144 in the third outermost ring group 136 and the power core 112.

In addition, signal groups may be assigned to pins within a ring group in an effort to minimize the number of PCB layers. For example, signal Group 1 in FIG. 10A may include all of the pins of a large high speed data bus, while Group 2 may include all of the pins for an address bus. Because all of the pins of Group 1 are assigned to a single ring group 132, Group 1 routes escaping from the ASIC may be shallow and wide as shown.

This may be in opposition to the conventionally assigned pins of Group 5 as an example of a poorly chosen pinout, which leads to an undesirable deep and narrow escape profile. By deep and narrow, what is meant is that the pins within the group may cross multiple rings 130 and ring groups 132, 134, 136, thereby forcing routes to escape in multiple PCB layers and necessitating the use of vias to reach inner layers when adhering to the strategies disclosed herein. Shallow and wide escape profiles are preferred according to embodiments of the invention because they may avoid the use of unnecessary vias—the inclusion of which would create undesirable transmission line stubs—and may keep the layer count down, among other advantages.

Figure 10B:
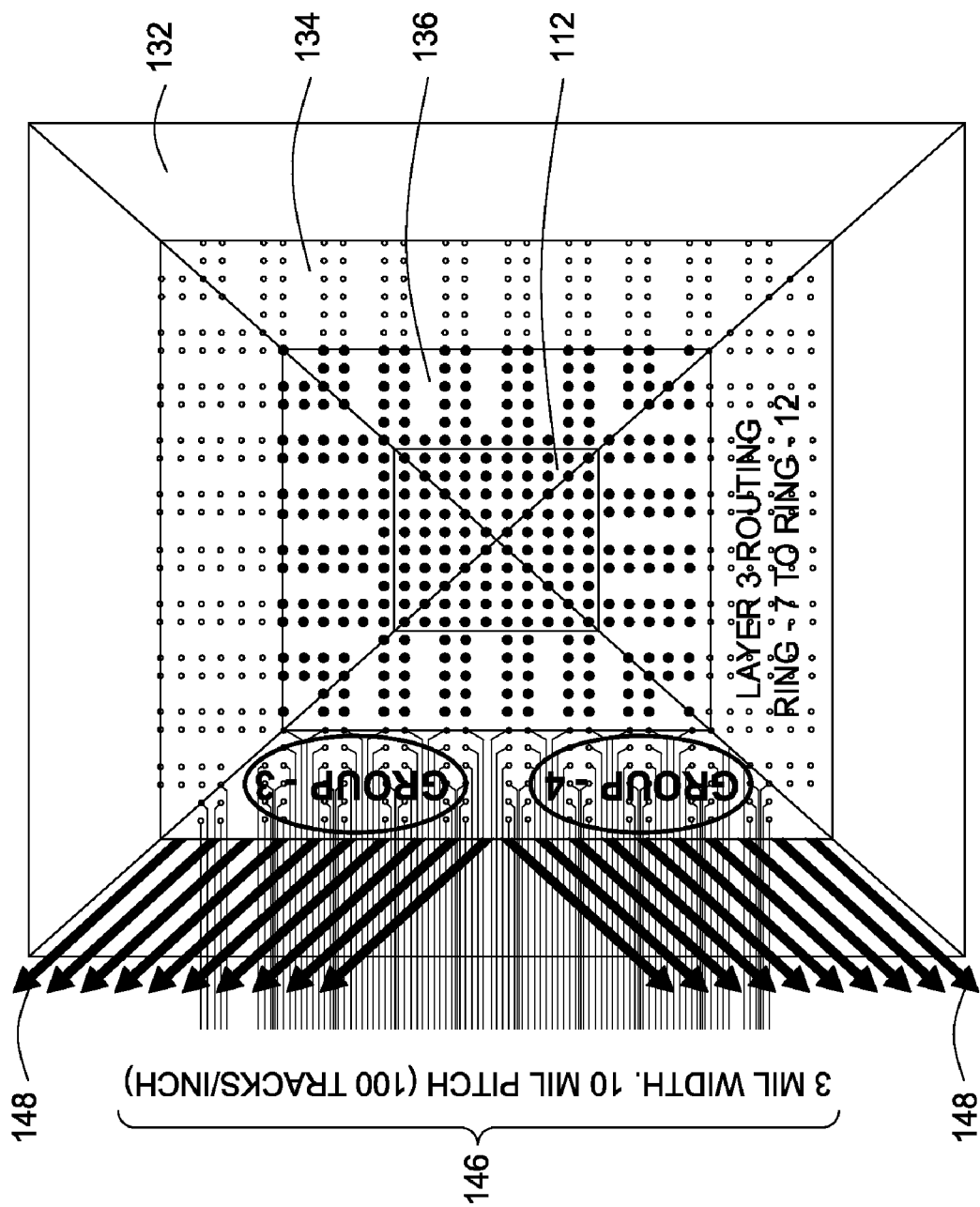

Referring now to FIG. 10B, the second outermost ring group 134 should contain rings 130 of pins that may be routed on the second most shallow internal layer (e.g., layer 3 or layer n−2) of the PCB as shown in this example layer 3 routing. To route signals of the second outermost ring group 134 from the pins of the ASIC to layer 3 or layer n−2, combinations of a blind µVia with a buried µVia or a blind µVia with a subcomposite via may be used.

The layer 3 traces 146 may be routed in the corridors of empty space created by the absence of the grounds in an L-shaped pattern 118 on this internal layer in a manner similar to the layer 2 example of FIG. 10A. Although shown substantially parallel to the layer 2 traces 140, these layer 3 traces 146 may be routed at an angle to the layer 2 traces 140 at some point (preferably starting as close to the ASIC pins to which the traces 146 connect) in an effort to avoid, or at least substantially reduce, potential crosstalk as depicted by the arrows 148 in the figure. Assuming pins of the outermost ring group 132 were routed away from the ASIC on layer 2 (or layer n−1) as described above, there should be nothing in the way to obstruct routes of the pins belonging to the second outermost ring group 134 from escaping the ASIC on layer 3 (or layer n−2). In other words, there are ideally no PTH vias, no subcomposite vias, and no traces.

Again, signal groups may be assigned to pins within a ring group according to the strategy of shallow and wide. For example, Group 3, which may include a cluster of clock signals, and Group 4, which may include a cluster of control lines, adhere to this strategy in the example of FIG. 10B.

Figure 11:
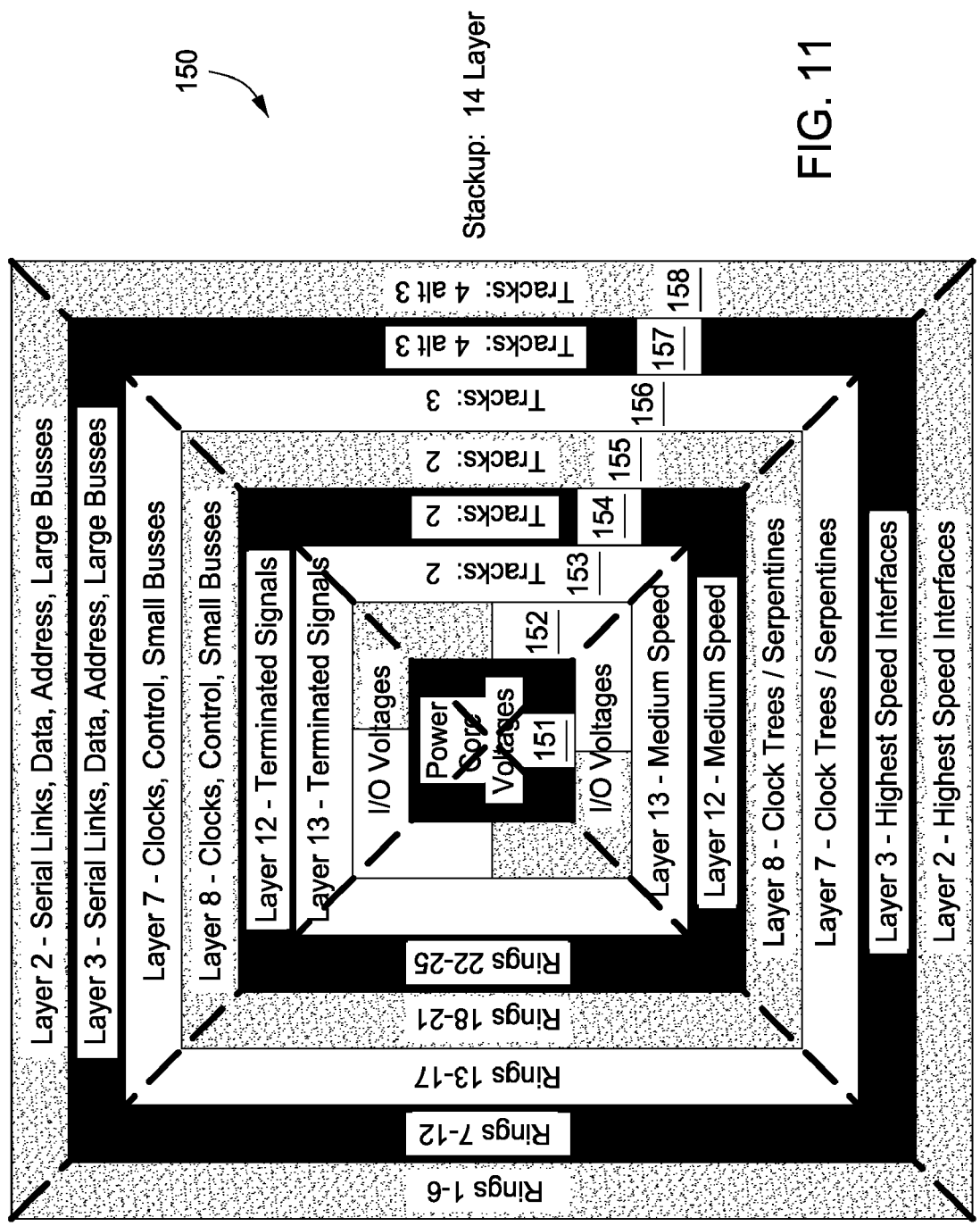
FIG. 11 illustrates an example mapping of ASIC pin assignments by category corresponding to PCB layers.

Because an ASIC may provide access to so many different types of signals on its pins, a carefully devised strategy may be utilized to assign the signals within a signal group to a certain ring group. A well thought-out ASIC pinout derived from this strategy may lead to a PCB layout with a reduced layer count, and hence, a potentially higher manufacturing yield from the PCB vendor, and higher signal integrity over conventional designs. FIG. 11 is a mapping 150 of ASIC pin assignments into ring groups, which also correspond to PCB layers, by signal category in an effort to strategically route nets away from the ASIC according to embodiments of the invention. The mapping 150 of the example is for a 14-layer board, but those skilled in the art will recognize that the same general ideas may be extended to boards with other layer counts. Also, the shapes of the different groups within the mapping 150 may be considered as guidelines for the ASIC pinout and corresponding PCB layout, and therefore, need not be strictly adhered to. Some applications may call for flexibility and certain tradeoffs when assigning pins or routing escapes away from the ASIC.

Figure 12:
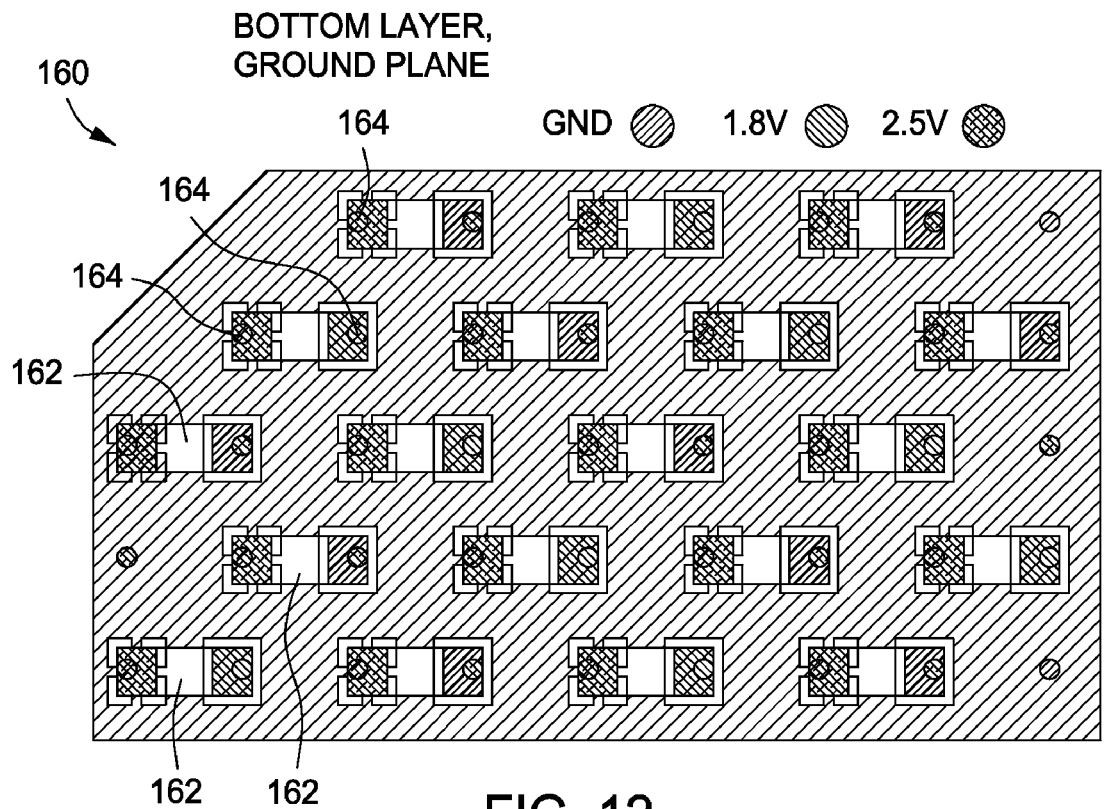
FIG. 12 illustrates an example location of termination resistors and/or bypass capacitors within the pin field of an ASIC.

Starting from the center 151 of the mapping 150 and working outwards, the signal speed may increase and/or the amount of associated circuitry may decrease as general rules. As such, the power core voltages should remain at the center 151 of the ASIC as previously described. The power core voltage pins may have bypass capacitors, filter inductors, and other components associated with them. By keeping these pins in the center of the ASIC and placing their associated components on a PCB surface layer opposite the ASIC, PTH vias or, more preferably, a combination of blind µVias 164 and subcomposite vias may be used to connect these elements together, while placing the associated components 162 within the ASIC pin field 160 as shown in FIG. 12.

Keeping the bypass capacitors and other associated circuitry 162 within the ASIC pin field 160 may lead to reduced surface area real estate consumed by an ASIC and its associated circuitry 162 on a PCB, which may, in turn, lead to smaller board designs, potentially more boards per PCB panel, and reduced manufacturing costs over traditional designs using PTH vias with a cuboidal escape profile. Moreover, by permitting bypass capacitors within the pin field so that valuable board real estate may not be wasted, the use of expensive and usually subpar Zycon buried capacitors (ZBCs) may be unnecessary in boards laid out according to this strategy. Furthermore, in keeping with the strategy of placing associated circuitry within the ASIC pin field on an opposing surface layer, vias may most likely be utilized to make these connections, not to mention the connections to internal power planes. Therefore, it may be advantageous to assign these power supply voltages to ASIC pins in the center 151 in an effort to avoid blocking routes from escaping the ASIC on all internal PCB layers.

The next tier 152 of the mapping may be reserved for input/output (I/O) pins. These signals may typically be routed to connectors potentially on the edge of the board for interfacing with circuitry external to the PCB. These I/O signals may be routed on any layer after other critical nets have been routed, but vias may most likely be used for this routing and may not compromise the signal integrity of the I/O signals.

Terminated and/or medium speed signals may share the next two mapping tiers 153, 154. On a 14-layer board, these signals may be routed to escape from the ASIC on layers 13 and 12 (or layers n−10 and n−11 if the ASIC is on the bottom surface layer), respectively. On an ASIC with a 1.0 mm pitch that can be laid out on a 14-layer PCB with 3.5 mil trace widths and 4.0 mil spacing, as in the present example, the mapping tiers 153, 154 associated with terminated and/or medium speed signals may correspond to rings 22-25. Terminated signals may have associated circuitry, such as series or parallel termination resistors, placed within the ASIC pin field on an opposing surface according to embodiments of the invention. Blind μVias and subcomposite vias may be used to route between the ASIC pins and the termination components, and therefore, it may be advantageous to assign these terminated signals to ASIC pins near the center 151 in these particular mapping tiers 153, 154, in an effort to avoid obstructing routes from escaping the ASIC on other internal PCB layers. Furthermore, by allowing termination resistors into the ASIC pinfield, associated trace topologies may be simplified in the critical region near the ASIC. This, in turn, may eliminate or significantly reduce signal reflections, which should make the signal edges more deterministic, thereby contributing to higher timing margins.

Clocks, control lines, and/or small busses may share the next two mapping tiers 155, 156. On a 14-layer board, these signals may be routed to escape from the ASIC on layers 8 and 7 (or layers n−7 and n−6 if the ASIC is on the bottom surface layer), respectively. On the example ASIC, the mapping tiers 155, 156 associated with clocks, control lines, and/or small busses may correspond to rings 18-21 and rings 13-17 to be escaped on the two different layers. Although clocks may be high frequency signals, they may not be the highest frequency signals in the ASIC or require the best signal integrity. Therefore, the use of subcomposite vias and the stubs they introduce may be acceptable. However, some clocks and other signals within these two mapping tiers 155, 156 may call for matched trace lengths with the use of serpentine traces (traces routed to provide an artificially long signal path in order to match trace lengths and hence, propagation delays between related signals). Thus, it may be advantageous to assign these signals to ASIC pins at these two mapping tiers 155, 156 and to route escapes from the ASIC on the first two layers where vias are employed to reach these layers with HDI technology. With this strategy, there should be very few, if any, obstructions to routing escapes away from the ASIC pins, especially on layer 7 or layer n−6. In addition, signals on these layers may be able to utilize buried via core (BVC) vias. BVC vias may reduce the number of subcomposite vias that might otherwise be required.

The two outermost tiers 157, 158 of the mapping 150 may include the highest speed interfaces according to embodiments of the invention. These signals may include serial links, quad data rate (QDR) lines, data and address lines, and large busses and should be routed on shallow internal layers. Therefore, on a majority of multi-layer PCBs including the example 14-layer board, these signals may be routed to escape from the ASIC on layers 2 and 3 (or layers n−1 and n−2 if the ASIC is on the bottom surface layer). On the example ASIC, the mapping tiers 157, 158 associated with serial links, data and address lines, and large busses may correspond to rings 1-6 and rings 7-12 to be escaped on the two different layers.

With HDI technology, these two layers with the highest speed interfaces may use blind and buried μVias to connect with corresponding ASIC pins without the use of any PTH or subcomposite vias that would introduce stubs that may compromise signal integrity. Thus, using blind and buried μVias may significantly reduce pin-to-pin crosstalk within the two outermost tiers 157, 158. For example, a 26-layer PTH technology board having a thickness of about 120 mils may be converted to a 14-layer HDI board according to embodiments of the invention. In such a case, the parallel length of adjacent vias should be reduced in the two outermost tiers 157, 158 from approximately 120 mils to 7 mils, the combined height of a blind and a buried μVia. Moreover, by using a surface layer ground plane just above or below the two shallowest internal layers, this layer pair may be stubless with a near-perfect return path. In addition, by escaping these highest speed interfaces at the periphery of the ASIC, thereby minimizing the routing distance between the ASIC and another component, the series inductance on a trace may be reduced over conventional designs. Such planning may allow for communication at speeds unattainable by conventional ASIC pinouts and corresponding layouts. Shorter trace lengths may also mean less undesirable intersymbol interference (ISI).

Figure 13:
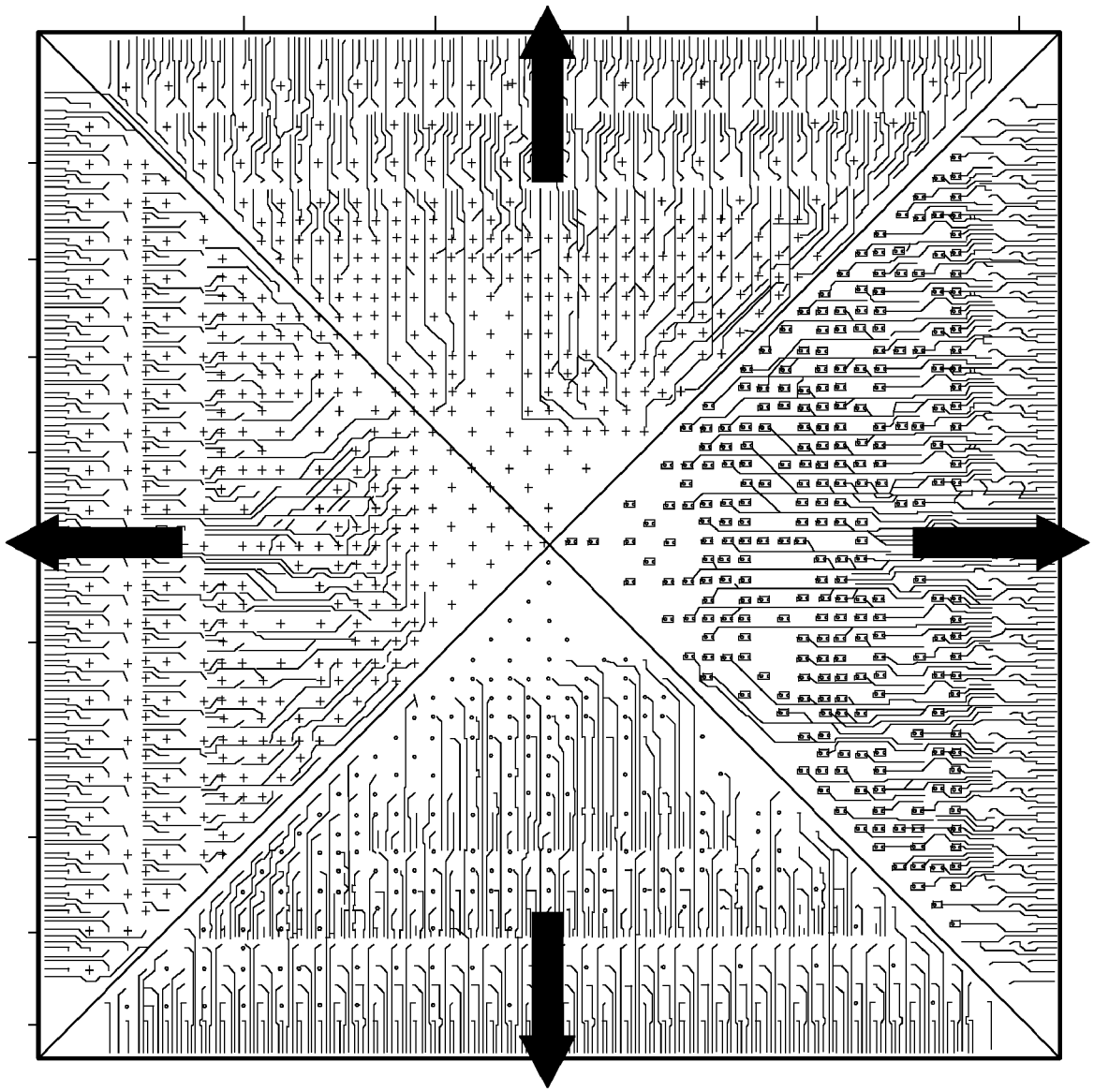
FIGS. 13 and 13A-C illustrate an example PCB layout corresponding to an ASIC showing rings and quadrants corresponding to different PCB layers.
Figure 13A:
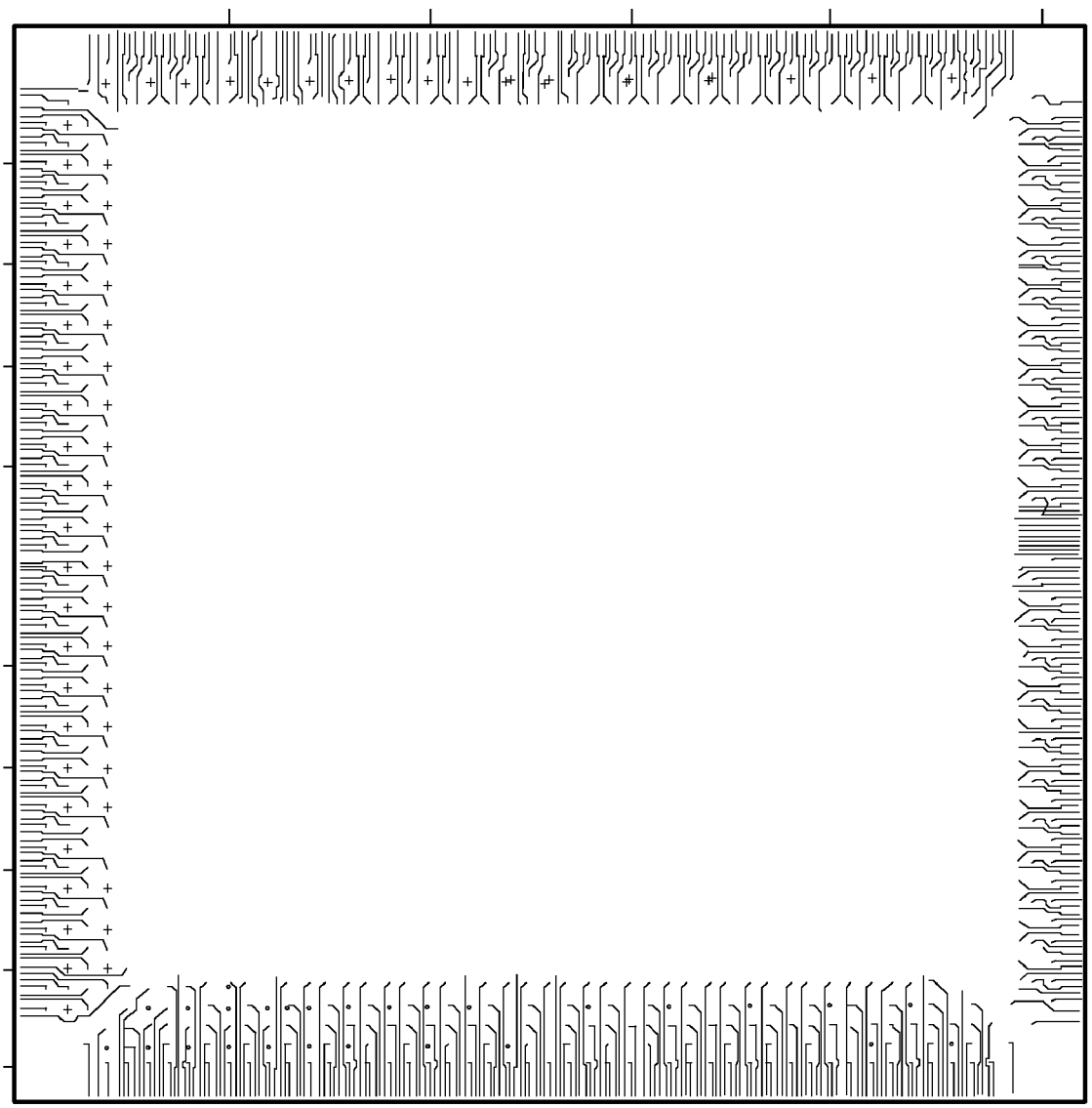
Figure 13B:
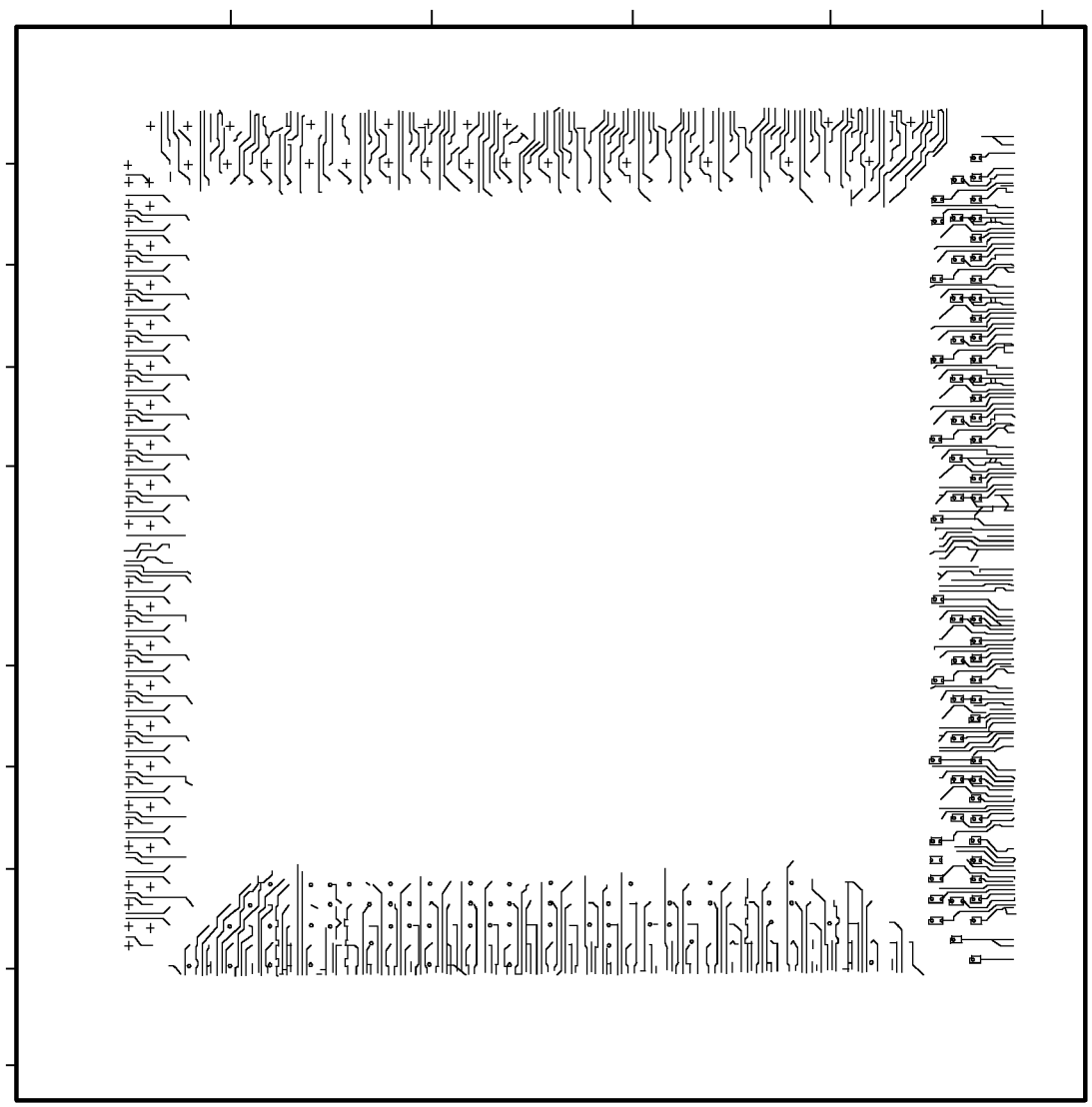
Figure 13C:
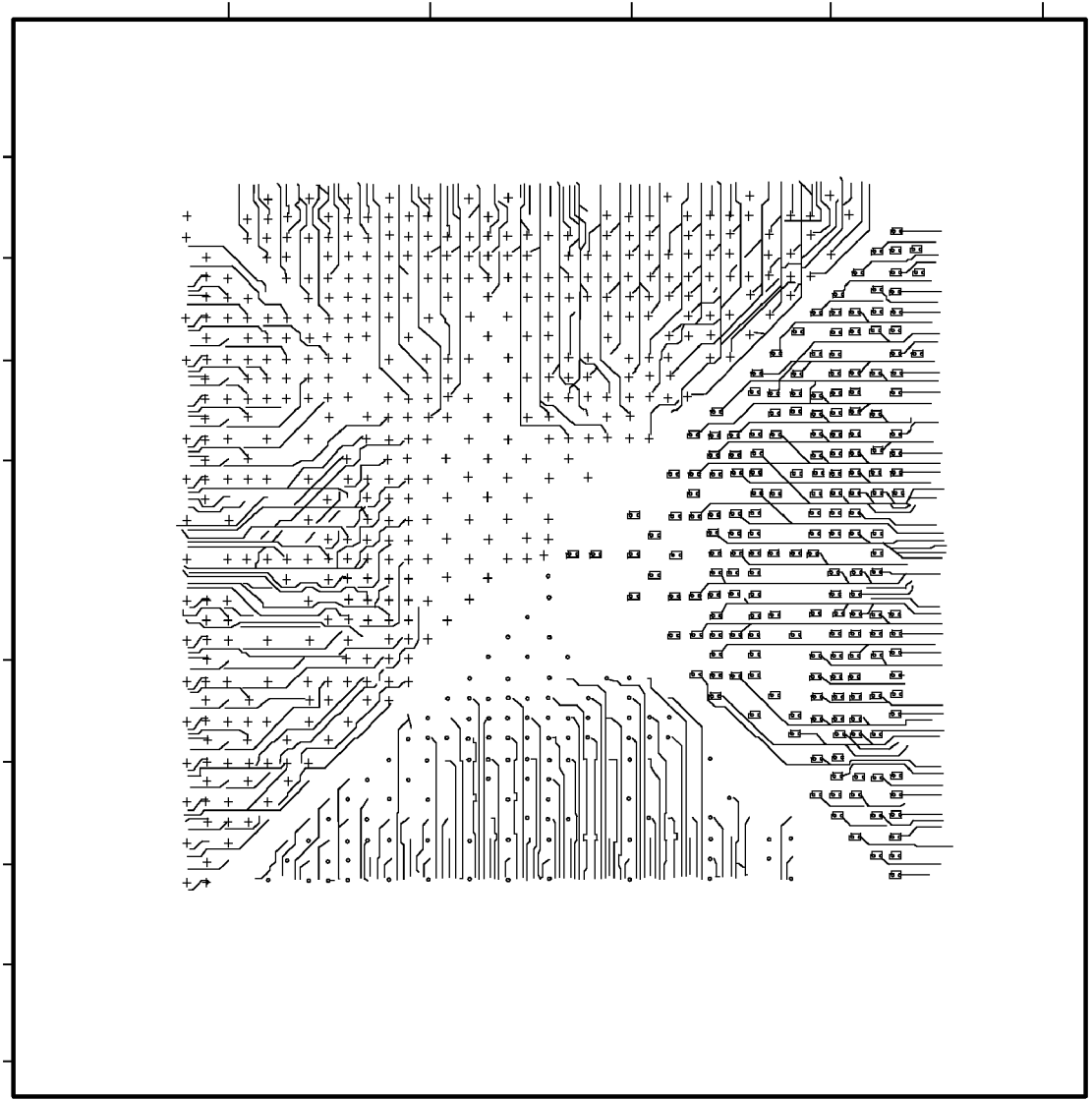

FIG. 13 is an example of a PCB layout 170 corresponding to an ASIC showing all signal layers of a 12-layer board. This figure illustrates how nets may be routed to escape the ASIC by rings and quadrants and how the rings correspond to different PCB layers according to strategies discussed above and incorporated by some embodiments of the invention. FIGS. 13A-C illustrate the PCB layout 170 of FIG. 13, but are decomposed to show only those traces routed on a particular pair of signal layers corresponding to the tiers of the mapping 150. Since these layout examples are for a 12-layer board, the layer numbers may be different than for a 14-layer board. Therefore, FIG. 13A shows the traces routed on layers 2 and 3 corresponding to the two outermost tiers 157, 158. FIG. 13B portrays the traces routed on layers 6 and 7 of the second outermost tiers 155, 156, and FIG. 13C depicts the traces routed on layers 10 and 11 of the third outermost tiers 153, 154.

Figure 14:
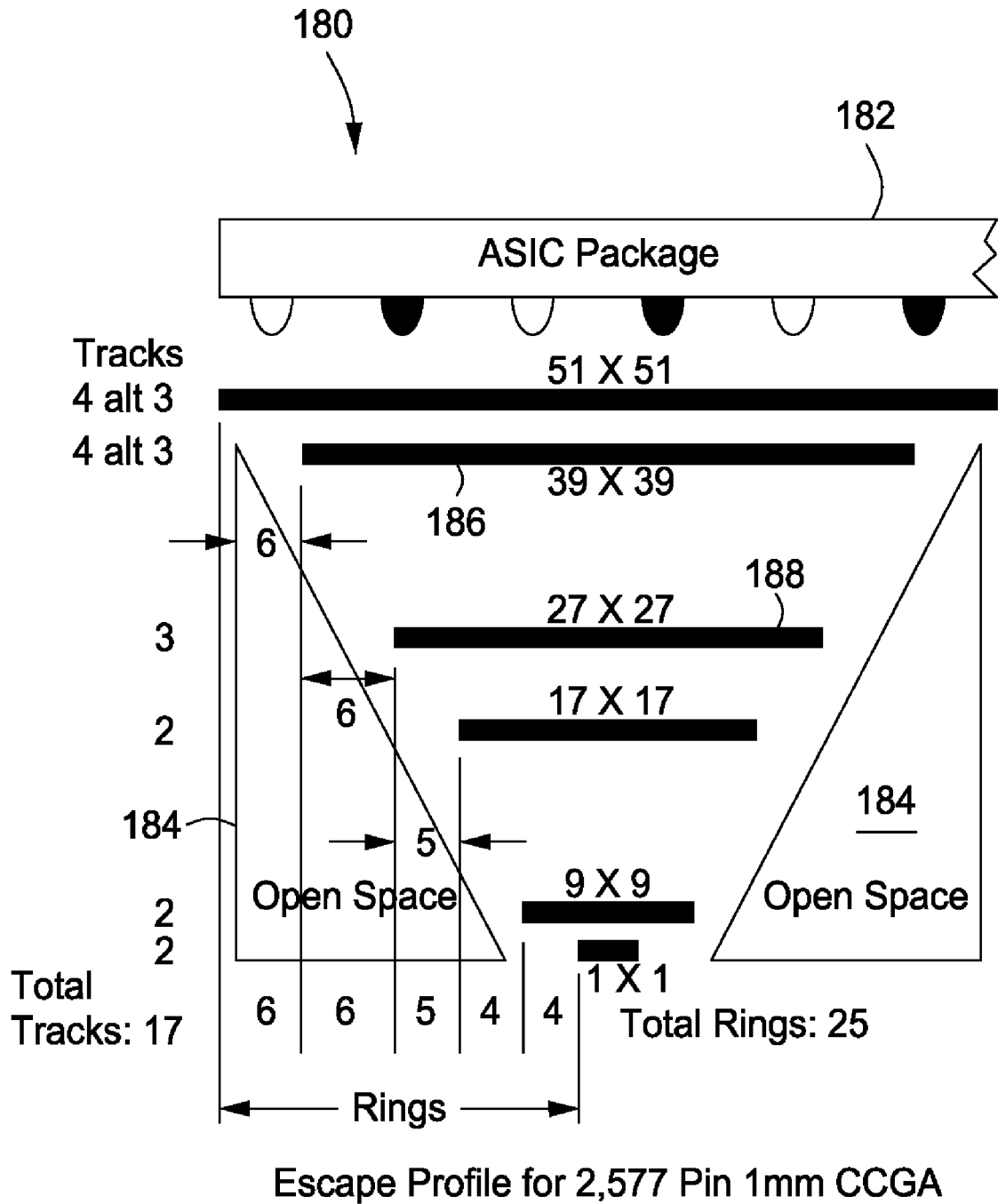
FIG. 14 is an example PCB stackup diagram illustrating a pyramidal escape profile in cross section for routing nets away from a portion of a BGA ASIC.

By following the ASIC pinout mapping 150 and the corresponding PCB layout guidelines, the escape profile 180 for an ASIC 182 according to embodiments of the invention may be shaped like an inverted pyramid, as shown in FIG. 14, rather than a cube as in conventional layouts. The densest population of subcomposite vias should be in the center of the ASIC 182 where the power core 112 may reside without any grounds in an L-shaped pattern 118, and the subcomposite via density should decrease as one moves towards the edges of the ASIC 182. Thus, there may be more and more open space 184 available for routing as one moves orthogonally away from the plane of the ASIC 182 (i.e., into PCB layers further away from the ASIC 182). For example, a 51 pin×51 pin ASIC may have an outermost ring group with 6 rings routed to escape from the ASIC 182 on a shallow layer, effectively leaving a 39×39 pin matrix 186. Another group of 6 rings may be routed to escape from this matrix, effectively leaving a 27×27 pin matrix 188. If μVias were used to reach these first two internal layers, then approximately half of the ASIC 182 may have been routed without the use of subcomposite or PTH vias, leaving nothing but open space 184 available for routing in the periphery of the ASIC upon observing further internal layers.

By studying the escape profile 180 of the highest pin count ASIC on a PCB, it may be possible to accurately predict the PCB layer count needed to route an entire board before layout begins by applying the techniques disclosed herein. In other words, by knowing the ASIC pin pitch, the pin count, and the PCB manufacturability guidelines (e.g., minimum trace width and minimum spacing between elements), a PCB designer may be able to calculate the number of traces that can be routed in the corridors of empty space left by the grounds in an L-shaped pattern 118 and between all remaining pins on a given layer. With this information and the number of desired power core voltage and ground pins, the designer may be able to calculate the number of rings, and hence, pins that may be routed to escape from the ASIC on a given layer. By adding up the layers necessary to escape all the signal pins and combining this number with the number of desired ground and power plane layers in the desired stackup, an accurate layer count may be calculated.

Figure 15:
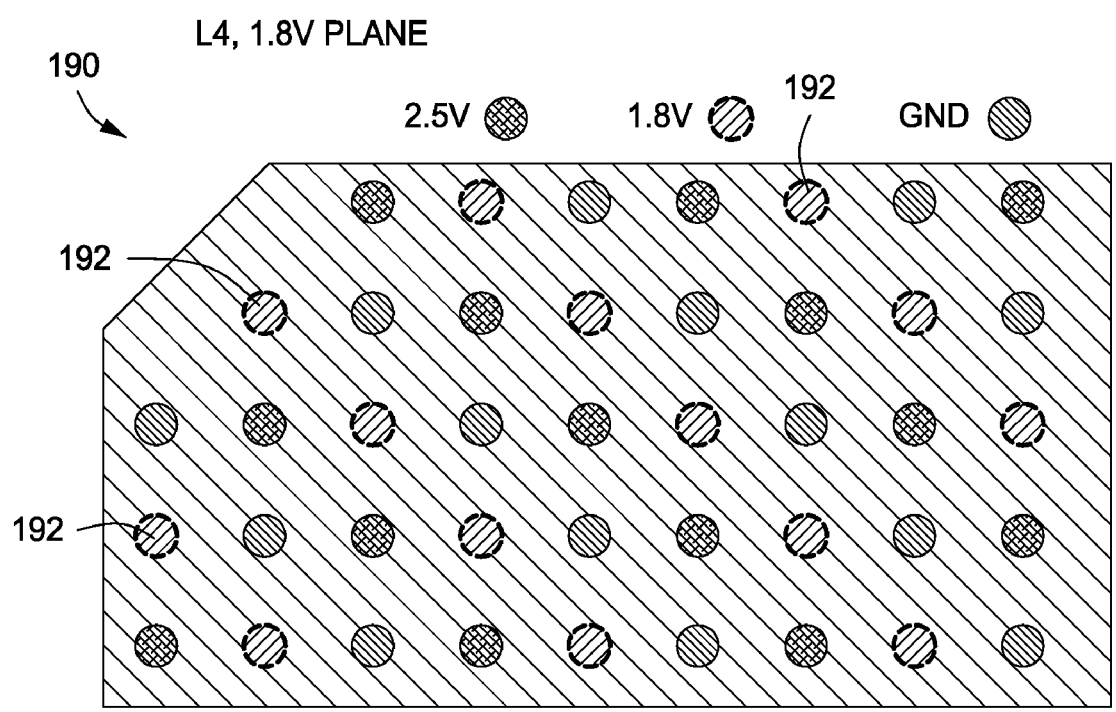
FIG. 15 illustrates an example inner layer power plane layout underneath a portion of an ASIC with a decreased number of vias puncturing the inner layer.

By strategically planning the ASIC pinout and corresponding PCB layout, the integrity of a power plane 190 residing on an internal layer, such as layer 4 in the example of FIG. 15, may not be compromised nearly as much as a power plane may typically be with a conventional layout using PTH technology. Even with some subcomposite via anti-pads 192 perforating the power plane 190, especially in and around the power core 112, the power plane 190 may cover 89% of the area given the dimensions of the plane shape. Anti-pads 192 may be used in an effort to achieve electrical isolation between the subcomposite via and the power plane 190. Capacitance between the power plane 190 and one or more ground planes may dominate as intended in order to provide a low impedance power source.

Figure 16:
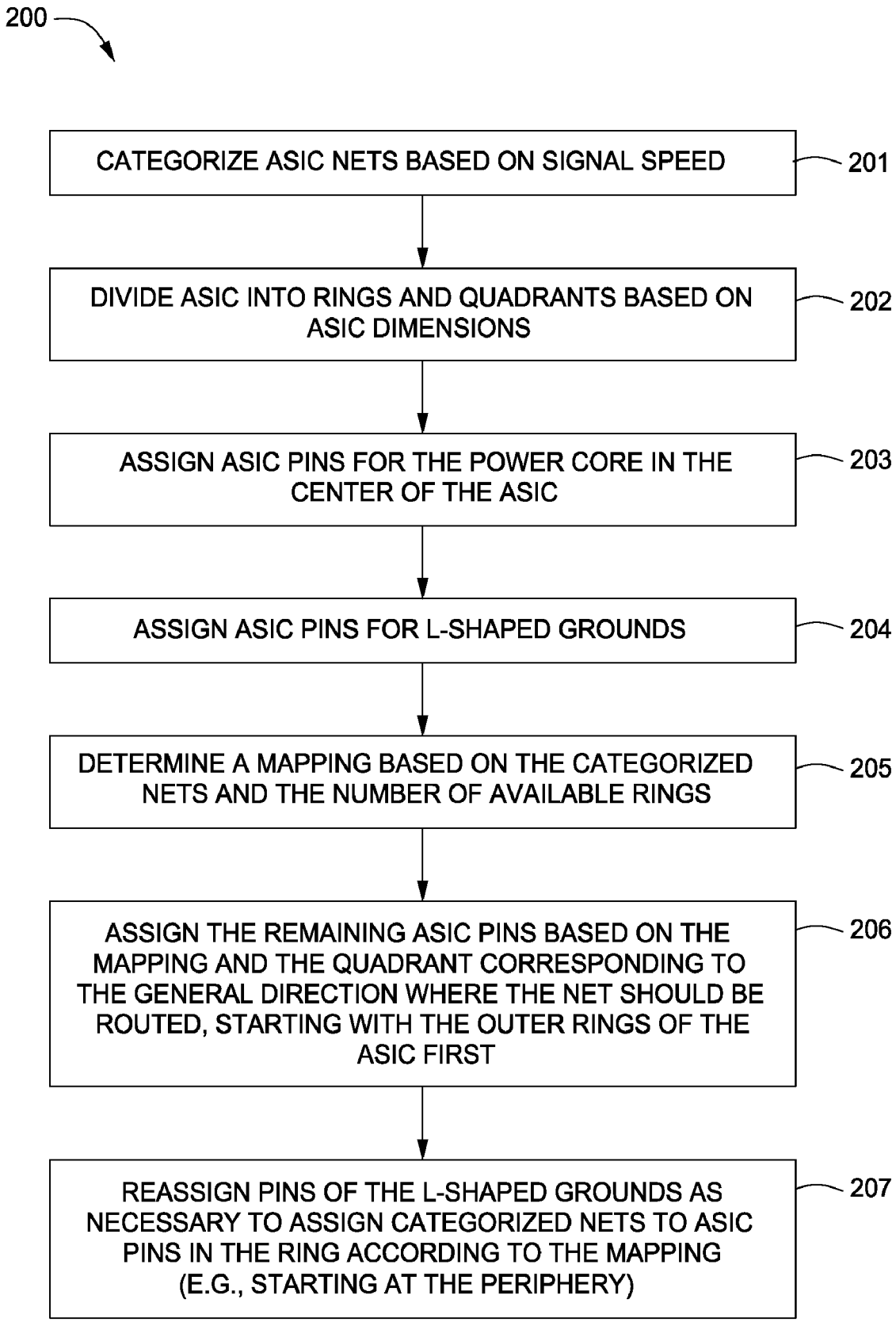
FIG. 16 is an example flowchart portraying a method of assigning ASIC pins.

FIG. 16 illustrates a systematic method 200 of assigning ASIC pins according to the techniques described thus far. This method may assume that the package size and pin count of the ASIC is already known, and some or all of this method may be automated. In step 201, a netlist of all the ASIC nets which interface with pins may be categorized based on signal speed and/or support circuitry, such as bypass capacitors and termination resistors. Power and ground pins may also be included in this netlist. This netlist may be created manually or automatically using a spreadsheet, a script operating on a text file, a program provided by the ASIC vendor that may be modified if desired, or other suitable means. The nets may be assigned to categories based on the levels suggested in the mapping 150 of FIG. 11.

In step 202, the ASIC may be divided into rings and quadrants. These divisions may be based on the dimensions of the ASIC. The division into quadrants may involve some board level planning so that a general signal flow may be known between the custom ASIC at hand and other electrical components in communication with the ASIC.

In step 203, the nets for the power supply may be applied to the power core 112 in or near the center of the ASIC. If the planned PCB stackup will include one or more internal ground planes, then some ground nets may be assigned to ASIC pins within the power core 112. This approach assumes that the intended number of power supply and ground nets to provide an appropriate current level on each supply voltage is already known and included in the netlist.

In step 204, the remaining ground nets may be assigned to ASIC pins in the L-shaped pattern described above and illustrated in FIGS. 5 and 6. By spacing the grounds in an L-shaped pattern 118 every three ASIC pins (i.e., where two rows or two columns of non-ground pins reside between the L-shaped ground extensions), every ASIC pin outside of the power core 112 should be adjacent to a ground pin. Preferably, L-shaped patterns near the power core 112 may be assigned to ASIC pins first with those in the periphery assigned last if ground nets still remain to be assigned. If the number of ASIC pins is greater than the number of nets interfacing with pins, then the remainder of the ASIC pins may be assigned to ground or left unconnected. If the pins are going to be assigned to ground, this may be done as a last step in an effort to ensure that all of the signal nets have first been assigned to pins in the proper ring groups and quadrants.

In step 205, a mapping for the signal nets may be determined based on the categories of nets (determined in step 201) and the number of rings and ring groups. The mapping may be based on signal speed and/or support circuitry. In such a case, the signals residing in tiers of the mapping may increase in speed and/or decrease in support circuitry as one moves from inner tiers to outer tiers of the mapping.

In step 206, the signal nets may be assigned to ASIC pins according to the mapping generated in step 205 and the quadrants created in step 202. The mapping tiers should correspond to ring groups, and these may be used as guidelines when assigning ASIC pins. Nets may be assigned to ASIC pins in the quadrant that would be closest to the location where a route escaping from the ASIC would travel if the ASIC was mounted on a PCB. Some forethought may be performed, for example, to determine a desired placement of components on the PCB relative to the ASIC. The signal nets may also be assigned to ASIC pins in a quadrant adjacent to the desired shortest-path quadrant if, for instance, too many nets would travel to the same location, but there are not enough remaining pins in the shortest-path quadrant of a particular ring group. Since the high speed signal nets are likely the most critical nets, one strategy may be to assign the high speed signal nets to the outer rings first and then move inward towards the power core 112 to assign the remaining signal nets.

If pins are scarce when assigning nets to pins within a ring group, then some of the pins of the grounds in an L-shaped pattern 118 may be reassigned to be signal nets in step 207. This conversion of ground pins should be done in the periphery of the ASIC first. By removing potential grounds in an L-shaped pattern 118 in the periphery of the ASIC first, the ability to route escapes away from the ASIC may remain higher than if potential grounds in an L-shaped pattern 118 near the power core 112 were removed.

An Example Signal Flow

Now that assigning pins and escaping from a single ASIC have been described, advantages gained when connecting an ASIC or any other IC with an improved pinout according to embodiments of the invention to another ASIC with an improved pinout (or any IC) will be discussed.

Figure 17:
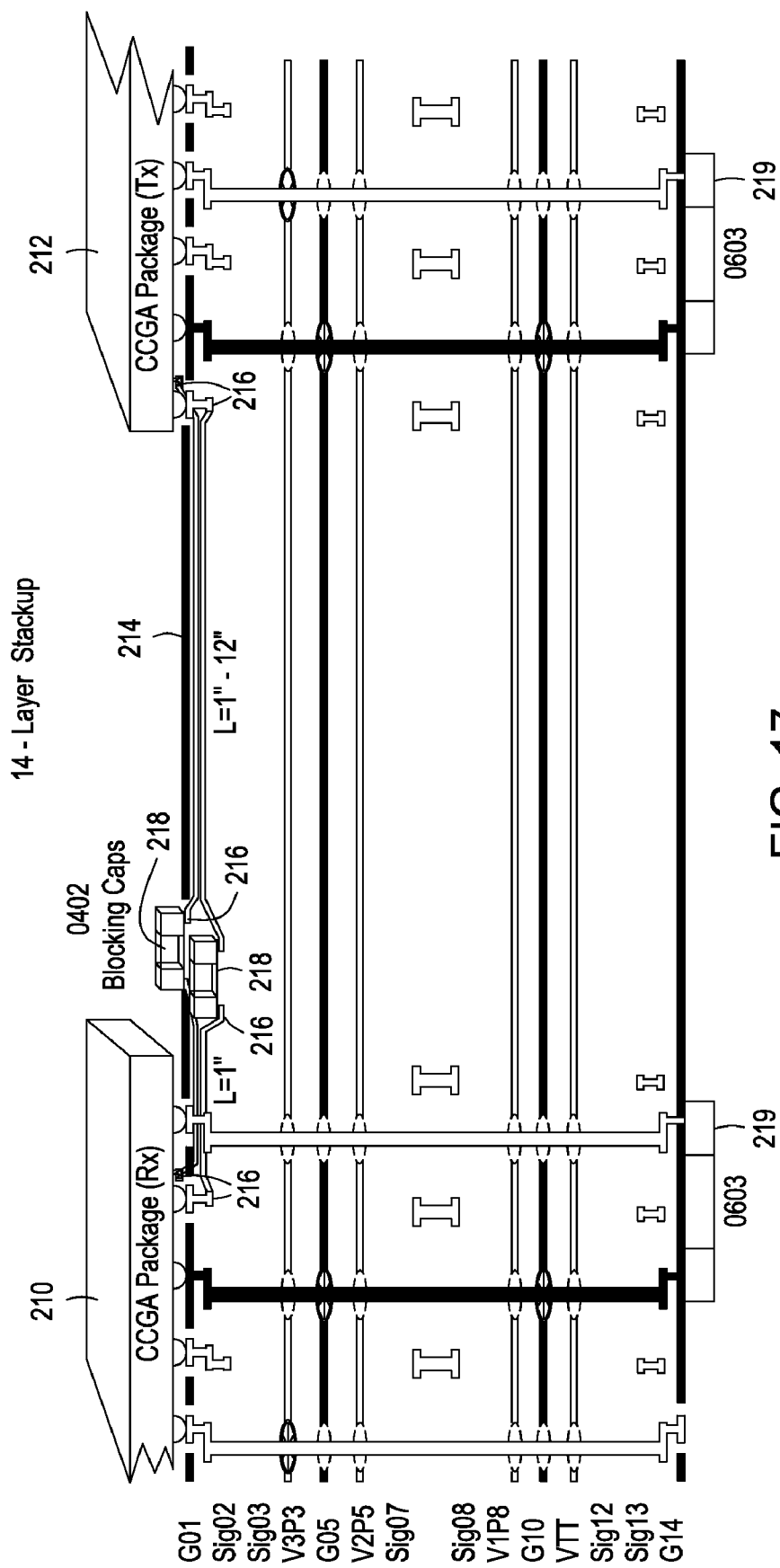
FIG. 17 illustrates an example PCB stackup diagram depicting a differential high-speed signal routed between two different integrated circuits with serial DC blocking capacitors.

Referring to FIG. 17, the same two ASICs 210, 212 for transmitting and receiving a serial link 214 may have their pins assigned according to the strategies outlined above. In this case, the high speed serial link may be routed on a shallow layer, such as layer 2, without any PTH vias or subcomposite vias acting as stubs to create reflections and degrade the signal integrity. Blind μVias 216 may be used to route between the pins of the ASICs 210, 212 and the serial link 214. Furthermore, the DC blocking caps 218 may be connected to the serial link 214 via blind μVias 216, again without PTH vias to create additional stubs. A stubless trace should allow for greater transmission speeds than a trace with stubs and still provide for an acceptable eye pattern. Because support circuitry 219, such as termination resistors and bypass capacitors, may reside within the ASIC pin field on an opposing surface layer from the ASIC according to embodiments of the invention instead of surrounding the ASIC on the same surface layer, circuitry for signal integrity, such as DC blocking caps 218, may be placed right next to the ASIC as desired.

Figure 18A:
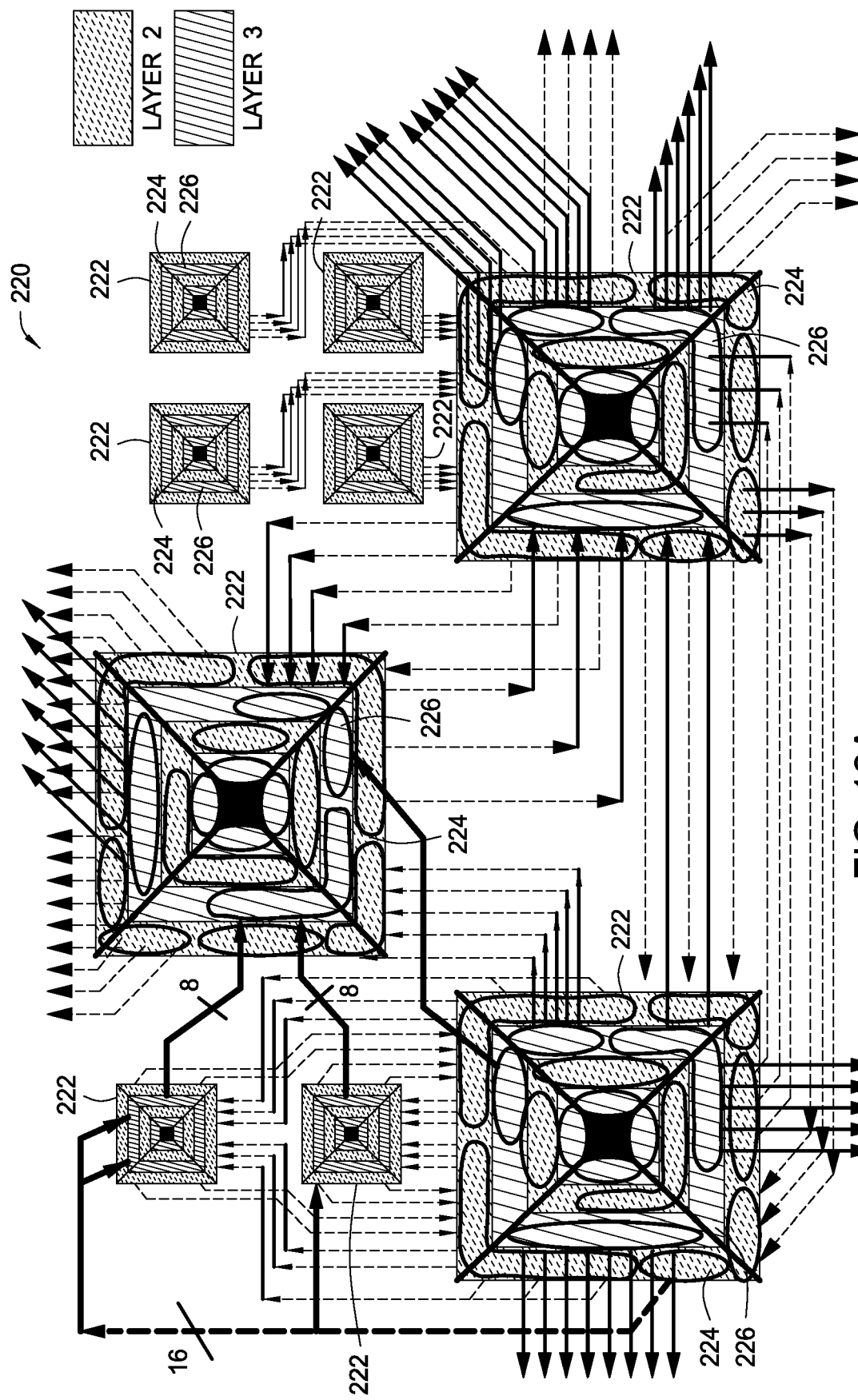
FIGS. 18A-B are example signal flow planning diagrams with layer-pair containment of nets between integrated circuits utilizing rings and quadrants.

FIG. 18A is an example of a signal flow planning diagram 220 for layer 2 and layer 3 of a 14-layer board stackup where the ASIC pinouts and corresponding PCB layouts were created according to embodiments of the invention described above. As illustrated in the figure, the signals should escape in the general direction of the quadrants. Being two of the shallowest layers, layers 2 and 3 may contain the highest speed signals. These signals may be connected between all of the integrated circuits 222 only on these two layers, even if signals are routed between layers using buried μVias. This strategy of routing signals belonging to two ring groups 224, 226 between two integrated circuits 222 using only two PCB layers may be referred to as "layer-pair containment." The signal flow planning diagram 220 may also be used to avoid or reduce crosstalk of signals on layer pairs by ensuring that signals are never routed in parallel on two different layers exceeding a certain permissible distance, as shown in the figure.

Expressed another way, layer-pair containment may dictate that ICs involved in a point-to-point interface should be mapped to the same pair of PCB layers, usually adjacent to one another. Layer-pair containment may be an important strategy for avoiding unnecessary stubs on signal paths, especially on high speed signal paths. In shallow layers, such as layers 2 and 3 or layers n–1 and n–2, where only μVias may be necessary using HDI technology, layer-pair containment may prove especially useful in improving signal integrity and allowing for higher speed transmission than possible using conventional layouts. As described with reference to FIGS. 4B and 5, a layer-pair μVia may have less parasitic inductance than the extra trace length of a serpentine trace. As a result, routing on two different paired signal layers with short, direct traces may be better than matching trace lengths with serpentine traces that have had to travel around obstructing traces or vias.

Figure 18B:
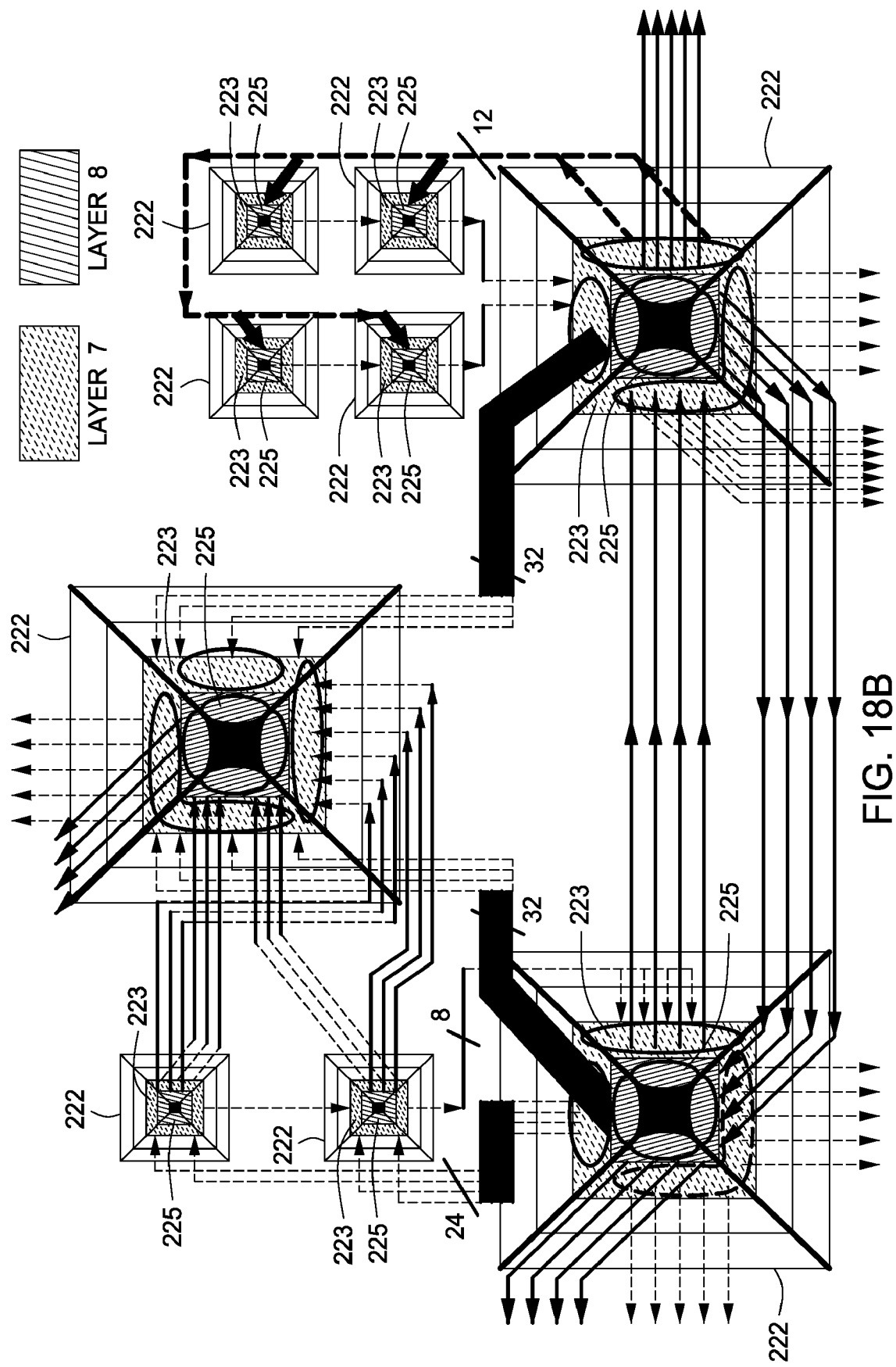

FIG. 18B is another signal flow planning diagram 221 with the same integrated circuits and 14-layer board stackup, but for layers 7 and layer 8 and their corresponding ring groups 223, 225. The strategy of layer-pair containment may be followed on these two layers, as well, when routing signals belonging to these two ring groups 223, 225 between the integrated circuits 222. Even though these deeper layers may employ subcomposite vias to route from the ASIC pins to the internal layers, some embodiments may utilize buried via core (BVC) vias to adhere to the strategy of layer-pair containment and avoid unnecessary stubs created by larger vias when applicable. BVC vias may be utilized, for example, to change layers when traces obstruct routing on a particular layer of the layer pair, to unscramble a signal order between the pins of one integrated circuit and another, or to match a via count between related signals. As shown in FIG. 18B, crosstalk between signals on layers 7 and 8 should be avoided, as well, by ensuring that signals are never routed in parallel on two different layers exceeding a certain permissible distance.

Another advantage that may be gained by applying strategies described herein may be that different ASICs assigned pins according to the same/similar strategy may be easily interfaced with one another. Layer-pair containment may be followed in an effort to connect nets belonging to the same pair of ring groups on both ASICs. Also, an ASIC pinout completed according to embodiments of the invention may be transferred to multiple designs with minimal, if any, changes. In other words, the pinout and potentially the layout of associated support circuitry and the routing of escapes away from the ASIC may hold true across multiple designs. If such an ASIC is placed in a PCB with a higher layer count, the corresponding layout may be expanded to fit the new stackup, but the pin assignments need not be changed. The only changes to the ASIC pinout, for example, may involve modifying the pin assignments within a given ring group between different quadrants to interface with components placed in different locations on the PCB than in the original design. The ring group to layer mapping, however, may remain the same for a given ASIC.

An Example Test Strategy for HDI

In order to gain access to signals for debugging in the lab or running an in-circuit test (ICT) suite in manufacturing, design and test engineers have conventionally used PTH vias as convenient test points, sometimes with a larger surface pad diameter (35 to 40 mils) for a "bed of nails" in the ICT fixture to make electrical contact. As illustrated in FIG. 4A and FIG. 5, however, the parasitic effects of PTH vias 96 may render them unacceptable for probing or accessing signals switching with frequencies higher than a few hundred MHz. According to the strategies of improved ASIC pinouts and corresponding PCB layouts described herein, the signal integrity may be improved to allow communication of signals into the multi-GHz range. Accordingly, a new method of accessing signals may be desired that may preferably also work with HDI technology both when debugging in the lab and when running manufacturing tests, such as ICT.

Referring to FIG. 19, a properly placed conductive dome 230 may provide a means to interface with an HDI technology μVia 232. Although the conductive dome 230 may comprise any electrically conductive material such as copper, gold, silver, or tin, which are common PCB materials, a simple dome of solder may be the simplest and cheapest to manufacture, as well as the most versatile for test connections. For some embodiments, the outer layer pad diameter of the conductive dome 230 may be in the range of 12.5 mils to 20 mils, while the inner layer pad diameter remains at 12.5 mils. As seen in FIG. 4B and FIG. 5, a μVia 92 may have a nearly negligible reflection coefficient, particularly when compared to a PTH via 96, and may present a virtually stubless transmission line load. Signal frequencies as high as 12 GHz may be successfully probed with this solder dome structure. According to the pin assignment/PCB layout techniques described herein, the highest speed signals should be routed on the shallowest internal layers (i.e., layers 2 and 3 or layers n–1 and n–2). Thus, a solder dome 230 coupled with a blind μVia 232 (as in FIG. 20A) or a combination of a blind μVia 232 and a buried μVia 234 (as in FIG. 20B) may be utilized in an effort to access high speed signals where a low reflection loss test point may be desired.

One advantage of the strategies presented herein may be that the high speed signals that are most affected by stubs should be routed on the shallowest internal layers, thereby allowing for the shortest test point stubs, even if this stub is a nearly ideal μVia 92. Also according to the pin assignment/PCB layout techniques described herein, higher speed signals should not reside on deeper internal PCB layers. As a result, a solder dome 230 may be coupled with any HDI component combination, such as a blind μVia 232 with a subcomposite via 236 as shown in FIG. 20C, and still used effectively. Even with a subcomposite via 236, combinations with a solder dome 230 may offer lower reflection coefficients when compared to conventional test points using PTH vias.

Figure 21:
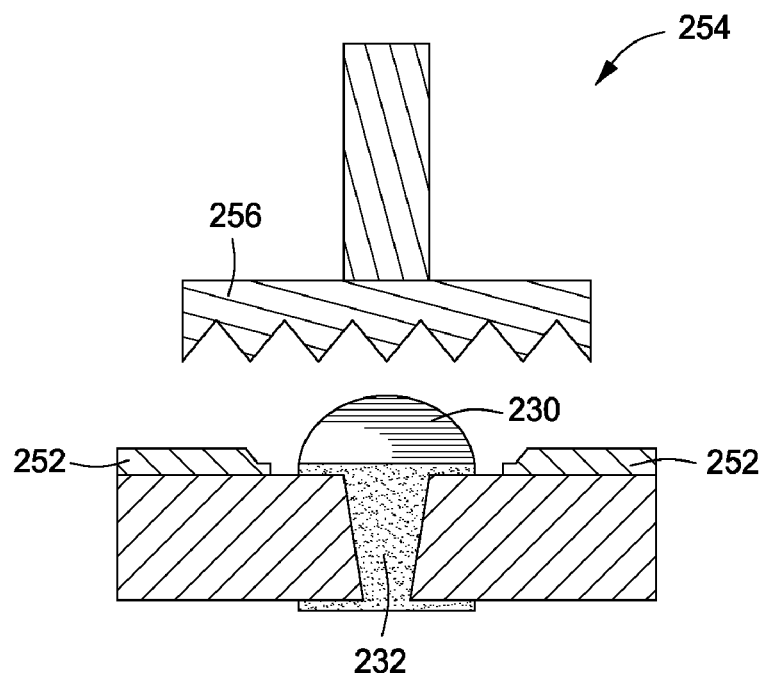
FIG. 21 is an example cross-sectional view of a test probe and the test point for a μVia of FIG. 19.
Figure 22:
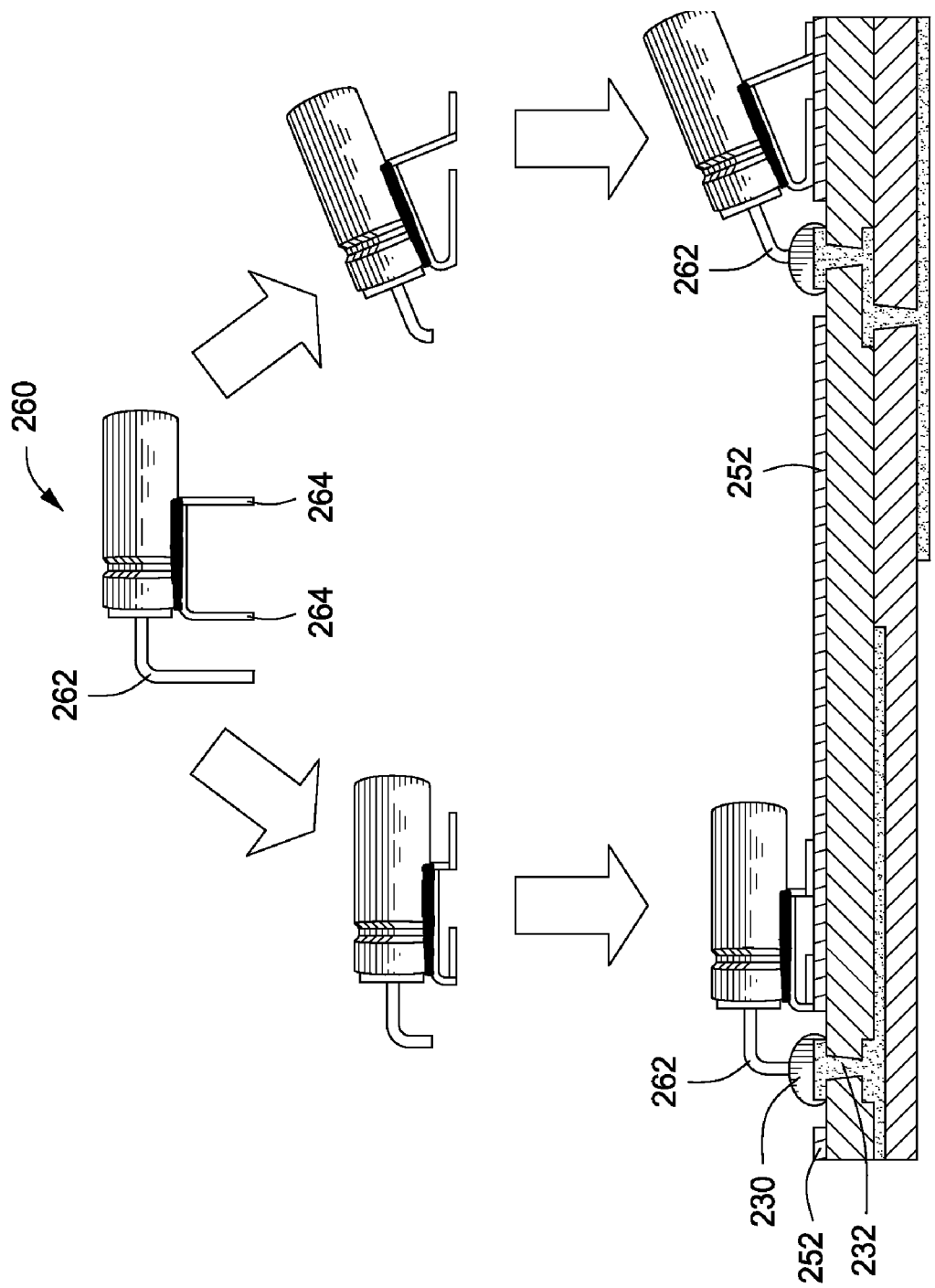
FIG. 22 is an example diagram illustrating different techniques to connect a mini socket to the μVia test point of FIG. 19.

Because the PCB surface layers should be ground planes 252 according to embodiments of the invention, a solder dome 230 may be probed, as illustrated in FIG. 21, without creating a large loop area to magnetically couple in noise. For some embodiments, a probe 254 with a round test head 256 configured to contact the solder dome 230 may be used to make electrical contact during ICT. For other embodiments, lab debugging may be accomplished by using conventional ("off-the-shelf") equipment, such as an Agilent N2766A Horizontal Mini Probe Socket 260 configured to deliver a high speed signal, such as an radio frequency (RF) signal, to an oscilloscope or network analyzer. The Agilent socket 260 may be connected with the tip 262 soldered to the solder dome 230 and the housing leads 264 soldered to the surface layer ground plane 252 in a manner similar to the two connection methods depicted in FIG. 22. A simple coaxial cable may also be used to connect with the solder dome 230 and the ground plane 252 for lab debugging.

Another enabling advantage of using conductive domes to interface with HDI technology μVias may be decreased pitch between test points used in ICT. Conventionally, the pitch between ICT test points using PTH vias (with a larger pad diameter of 35 to 40 mils) has been at least 50 mils. This conventional pitch allows for the PTH via pad diameter to compensate for all ICT fixture tolerances. Because the conventional ICT probe head shape is a needle point, all fixture tolerances should be covered by the test pad diameter, typically ±17.5 mils. In the case of solder domes, this tolerance may be shared between the dome diameter and the probe head diameter. For some embodiments, the conductive domes may have a pad diameter tolerance of 17.5 mils, and the ICT probes may have a tolerance of 17.5 mils, thereby allowing for a test point pitch approaching 35 mils and certainly less than the conventional 50 mils. This is a major advantage on a high-density printed circuit board.

Figure 23A:
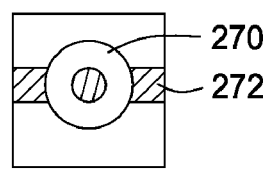
FIGS. 23A-C are example top views of placements for test points for the μVia of FIG. 19.
Figure 23B:
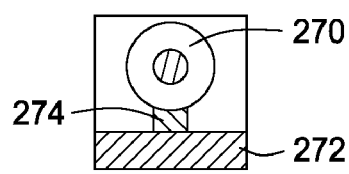
Figure 23C:
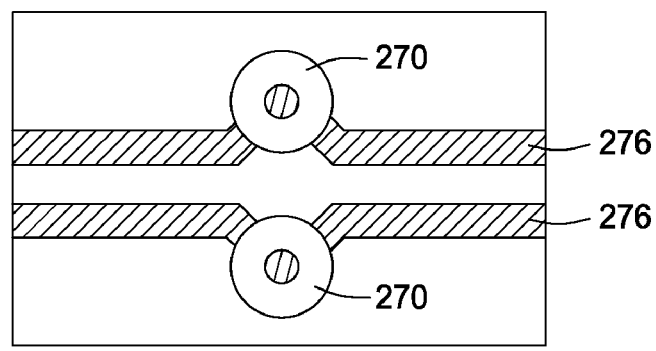

Referring now to FIG. 23A, a test point 270 using a solder dome 230 according to embodiments of the invention should be placed in line with the trace 272 to which it provides access. The test point 270 may ideally also be placed as close to the final receiver as possible in an effort to minimize reflections. If a solder dome test point is not properly placed along the trace 272, the trace 272 may exhibit large reflections, and the hardware engineer may not be able to validate or invalidate the signal. A stub 274, as shown in FIG. 23B, should not be used in conjunction with this test point 270, especially when a signal with frequency content greater than a few hundred MHz is being accessed. In FIG. 23C for differential signals 276, the test points 270 should be placed symmetrically in an effort to achieve the greatest common mode rejection. It may be acceptable to stagger the test points 270 for high speed digital signals, but radio frequency (RF) differential signals should be provided symmetrical test points 270.

To accomplish these test point placement rules for HDI test points 270 using solder domes 230, a manual or an automatic method may be used. In the manual method, for example, a hardware engineer may indicate the desired test point location on a schematic with a note or a net property. The engineer may then direct or at least review proper placement of the HDI test points 270 using solder domes 230 by a computer-aided design (CAD) technician during layout of the PCB.

Automation may be accomplished by an extraction software program. This program may examine the layout topology for a given net and may determine a proper placement of the test point 270 based on the layout topology. The software program may work with existing CAD software, such as Cadence Allegro, to actually place the test point 270 in the proper location, or a CAD technician may place the test point 270 after the extraction program indicates a proper location. The CAD software may generate an output file, such as a Gerber File, for the PCB fabrication house indicating the location of the test point 270, among other patterns used to assemble the PCB, such as land patterns, signal traces, drilled holes, and milling information.

Figure 24:
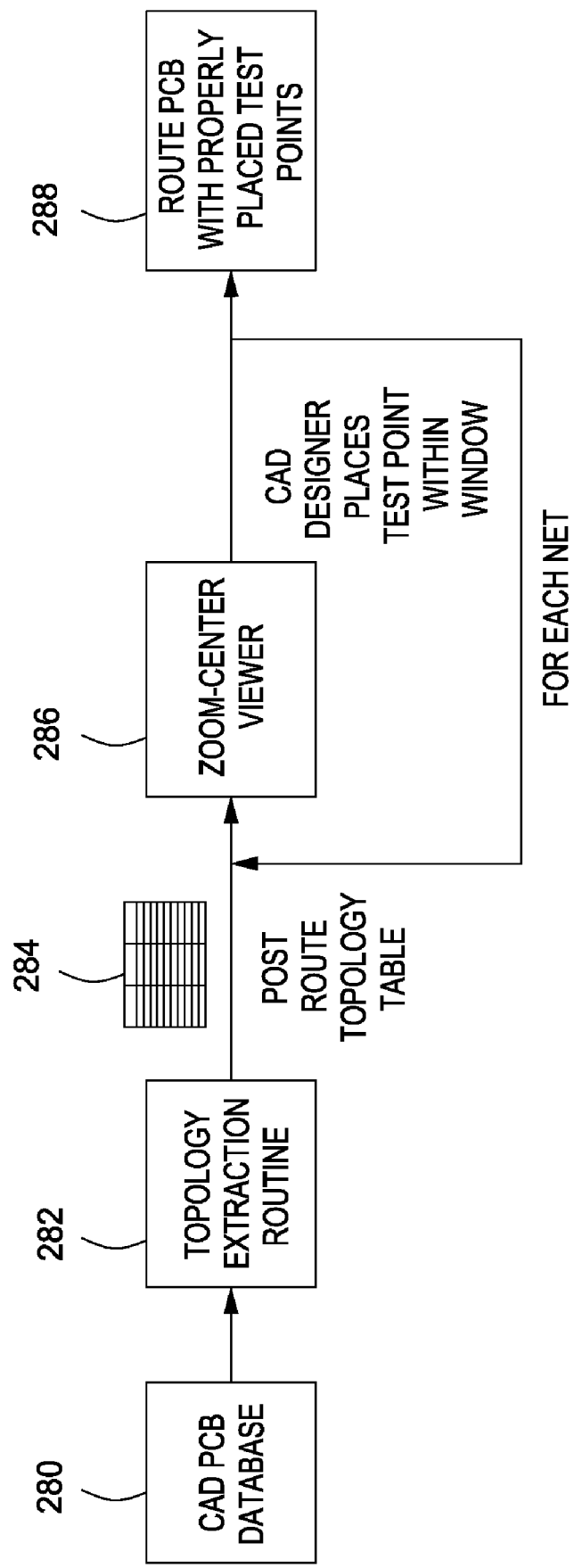
FIG. 24 is an example block diagram of a process for automatically identifying proper locations for conductive dome test points.

Referring now to FIG. 24, a CAD PCB database 280 may be generated during layout after all of the nets have been routed. The routing may preferably have followed the strategies described herein. At this point, the PCB may be ready for placement of the conductive dome test points. A topology extraction routine 282 may be executed on the CAD PCB database 280 to generate a post route topology table 284. During or prior to execution of the topology extraction routine, an operator, such as a hardware engineer, may enter dome probe net properties such that the conductive dome test points 270 are properly placed by the CAD technician. The design goal may be to place the test point 270 close to the final receiver pin for a given net that may be desired to be probed.

For each net associated with a test point 270, the dome probe net properties may include a reference designator, a priority number, and a proximity code. For some embodiments, the final receiver pin will be provided to the topology extraction routine 282. For other embodiments, the reference designator of the final receiver will be provided, and the extraction routine 282 may decode the correct receiver pin number. The priority code may be a ranking to determine which of the test points 270 should be placed first since they probe nets that are more critical, more sensitive, or higher speed. The priority code may enable the CAD technician to address and place these higher priority test points first. For some embodiments, the priority code may be a number between 1 and 5, with 1 being the highest priority and 5 being the lowest priority. The proximity code may restrict an area in which the test point 270 may be placed with respect to the final receiver pin. The proximity code may represent a radius or a dimension of a square for allowable placement of the test point 270. For some embodiments, the proximity code may range from A to E, where A=½", B=¾", C=1", D=1½", and E=2".

For each net in the post route topology table 284, preferably beginning with those nets with the highest priority according to the priority code, a zoom-center viewer 286 may aid the CAD technician in placing the test point 270 according to the dome probe net properties. The zoom-center viewer 286 may be a script that instructs the CAD software to highlight the net of interest, turning on the layers on which the net approaching the final receiver is routed and turning off the other layers. The zoom-center viewer 286 may also instruct the CAD software to turn on the top or bottom surface of the PCB where the test point will be properly placed according to the layers on which the net is routed. The zoom-center viewer 286 may also draw a window around the final receiver pin near which the test point 270 should be placed. The dimensions of the window may be determined by the proximity code, and the shape of the window may be a circle or a square, for example. For some embodiments, the zoom-center viewer 286 may allow the CAD technician to only view the area near the final receiver pin according to the proximity code.

Figure 25A:
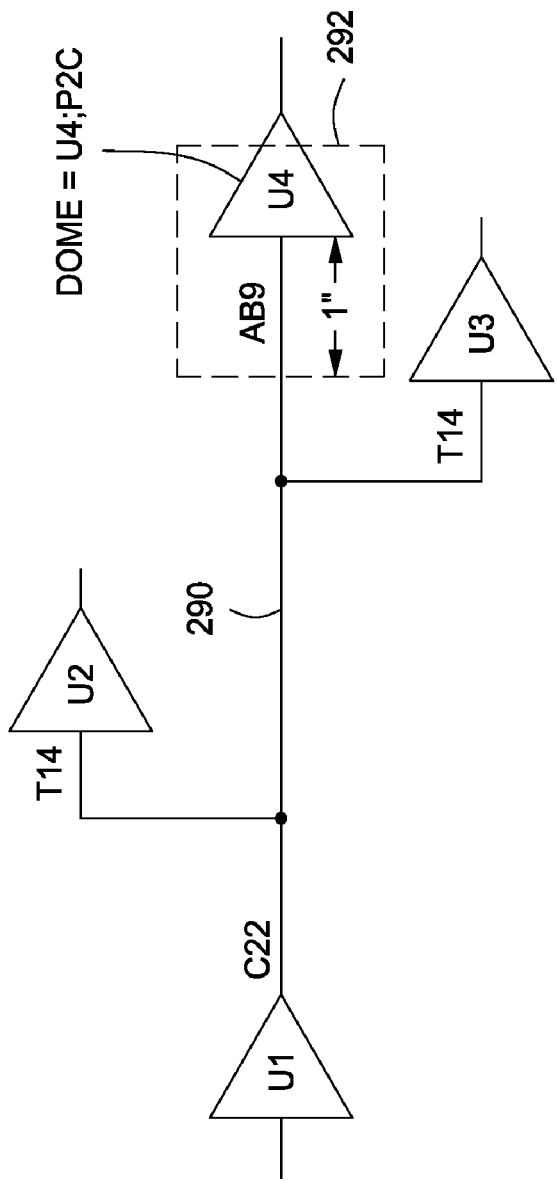
FIGS. 25A-B illustrate examples of net topologies and the syntax for dome probe net properties for a topology extraction routine.
Figure 25B:
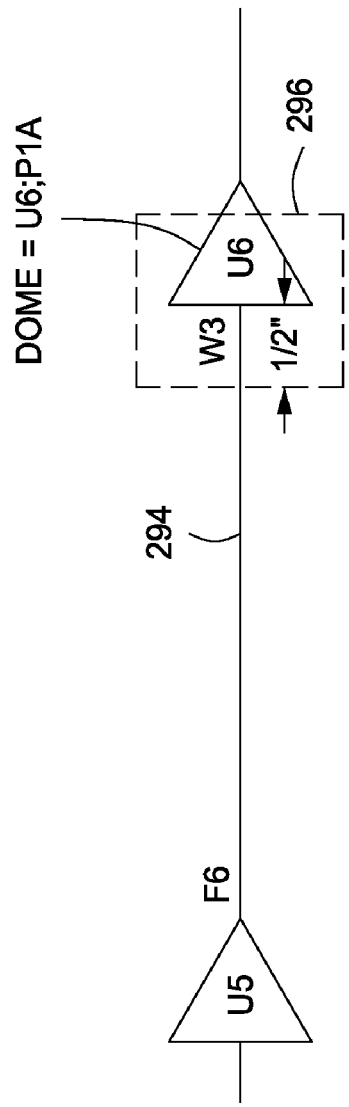

FIGS. 25A-B provide examples of the zoom-center viewer window for two different net topologies. In FIG. 25A, the net 290 has a driver U1, a final receiver U4 with a pin designated as AB9, and two other receivers U2 and U3. Dome probe net properties may have been associated with the net 290, and in this example, the syntax of the net properties assigned during the topology extraction routine are "DOME=U4;P2C." This syntax may indicate that a conductive dome 230 is to be placed within 1" (C=1") of the pin on U4 associated with the net 290 according to a square window 292. For some embodiments the window may be circular with a radius of 1". "P2" may denote that the test point 270 is to be placed with second highest priority.

The net 294 in FIG. 25B has a simpler topology: a driver U5 connected to a final receiver U6. This net 294 may be a higher speed net than the net 290 in FIG. 25A, and therefore, the dome probe net properties associated with the net 294 may have a higher priority with a smaller window for routing the test point 270. Accordingly, the syntax in this example is "DOME=U6;P1A" indicating that a conductive dome 230 is to be placed within ½" (A=½") of the pin on U6 (W3) associated with the net 294 according to a square window 296. "P1" may signify that the test point 270 is to be placed with the highest priority since net 294 is a critical, high speed net.

After the zoom-center viewer 286 performs its functions, the CAD technician may then place an HDI test point 270 comprising a conductive dome 230 and associated HDI structures, such as one or more μVias and subcomposite vias, to couple with the routed trace associated with the net nearly anywhere within the window. Of course, existing structures (e.g., surface components and inner layer traces) within the window may be avoided when placing the test point 270. For some embodiments or even for certain test points within the post route topology table (e.g., those test points with lower priority), the extraction software may place the test point automatically within the defined window without requiring intervention from a CAD technician. After placement of the test point 270, the post route topology table may be updated to indicate that the test point 270 has been routed for the associated net. The zoom-center viewer 286 may then move on to the next net according to the priority code. This process may be repeated for all of the nets having unplaced test points until a completely routed PCB 288 with properly placed test points is generated.

While the foregoing is directed to embodiments of the present invention, other and further embodiments of the invention may be devised without departing from the basic scope thereof, and the scope thereof is determined by the claims that follow.

The invention claimed is:

1. A method comprising:
dividing into a plurality of concentric rings an array of connections of an interface for an integrated circuit (IC) on a surface layer of a printed circuit board (PCB); and
coupling an interconnect to substantially all of the connections of each respective concentric ring to form a substantially pyramidal escape profile for the interface, wherein interconnects coupled to connections of outer concentric rings generally escape from the interface on shallower layers of the PCB than interconnects coupled to connections of inner concentric rings.

2. The method of claim 1, wherein the interconnect comprises at least one of a blind microvia (μVia), a buried μVia, a subcomposite via, or a combination thereof.

3. The method of claim 1, further comprising:
dividing the array of connections into two or more divisions; and
routing traces coupled to the connections in two or more directions based on the divisions.

4. The method of claim 1, wherein the signal speeds of traces coupled to the connections of the interface generally decrease from the outer concentric rings to the inner concentric rings.

5. The method of claim 4, further comprising routing high signal speed traces coupled to the connections substantially all on a first internal layer adjacent to the surface layer using only blind μVias to couple between the outer concentric rings and the high signal speed traces.

6. The method of claim 4, further comprising routing high signal speed traces coupled to the connections substantially all on a first internal layer adjacent to the surface layer and a second internal layer adjacent to the first internal layer using only blind μVias and buried μVias to couple between the outer concentric rings and the high signal speed traces.

7. The method of claim 4, further comprising:
supplying power to the interface by coupling subcomposite vias to the connections of the inner concentric rings; and
routing power traces or power planes to the subcomposite vias.

8. The method of claim 1, further comprising:
making the surface layer a ground plane layer; and
connecting a portion of the connections to the ground plane layer in L-shaped patterns such that lanes are provided on inner layers of the PCB for routing traces.

9. The method of claim 1, further comprising placing pads for IC support circuitry on an opposite surface layer of the PCB within the boundaries of the interface.

10. A method of escaping from an interface having an array of connections for an integrated circuit (IC) on a surface layer of a printed circuit board (PCB), the method comprising:
dividing the array of connections into a plurality of concentric rings organized into first, second, and third ring groups;
providing a blind microvia (μVia) for each of the connections of the first ring group at the periphery of the array;
providing a blind μVia coupled to a buried μVia for each of the connections of the second ring group adjacent to and inside the first ring group; and
providing a blind μVia coupled to a subcomposite via for each of the connections of the third ring group adjacent to and inside the second ring group.

11. The method of claim 10, wherein numbers of rings within the first, second, or third ring groups is limited by a number of traces that can be routed on a given layer of the PCB for all of the connections of the first, second, or third ring groups, respectively.

12. The method of claim 11, wherein a number of traces that can be routed on the given layer of the PCB is determined by a minimum trace width, a connection pitch, and a minimum spacing between traces.

13. The method of claim 10, further comprising:
dividing the array of connections into quadrants; and
routing traces coupled to the connections in four or more directions based on the division of the connections into quadrants.

14. The method of claim 10, wherein signal speeds of traces coupled to the connections of the interface generally decrease from the first ring group to the third group.

15. The method of claim 10, wherein an amount of IC support circuitry connections generally increases from the first ring group to the third group.

16. The method of claim 10, further comprising:
making the surface layer a ground plane layer; and
connecting a portion of the connections to the ground plane layer in L-shaped patterns such that lanes are provided on inner layers of the PCB for routing traces.

17. The method of claim 10, further comprising placing connections for IC support circuitry on an opposite surface layer of the PCB within boundaries of the interface.

* * * * *

UNITED STATES PATENT AND TRADEMARK OFFICE
CERTIFICATE OF CORRECTION

| | | |
|---|---|---|
| PATENT NO. | : 7,979,983 B2 | Page 1 of 1 |
| APPLICATION NO. | : 11/696670 | |
| DATED | : July 19, 2011 | |
| INVENTOR(S) | : Bird et al. | |

It is certified that error appears in the above-identified patent and that said Letters Patent is hereby corrected as shown below:

On the title page, item [54] and column 1, line 1, In the Title:

Please delete "CONNECTION AN INTEGRATED CIRCUIT ON A SURFACE LAYER OF A PRINTED CIRCUIT BOARD" and insert -- CONNECTING AN INTEGRATED CIRCUIT ON A SURFACE LAYER OF A PRINTED CIRCUIT BOARD -- therefor.

Signed and Sealed this
Thirtieth Day of October, 2012

David J. Kappos
*Director of the United States Patent and Trademark Office*